US012676545B2

(12) United States Patent
Mayell

(10) Patent No.: US 12,676,545 B2
(45) Date of Patent: Jul. 7, 2026

(54) DETECTING SIGNALS FROM CASCODE POWER DEVICES

(71) Applicant: Power Integrations, Inc., San Jose, CA (US)

(72) Inventor: Robert J. Mayell, Los Altos, CA (US)

(73) Assignee: Power Integrations, Inc., San Jose, CA (US)

( * ) Notice: Subject to any disclaimer, the term of this patent is extended or adjusted under 35 U.S.C. 154(b) by 153 days.

(21) Appl. No.: 18/435,296

(22) Filed: Feb. 7, 2024

(65) Prior Publication Data

US 2024/0283351 A1      Aug. 22, 2024

Related U.S. Application Data

(60) Provisional application No. 63/504,384, filed on May 25, 2023, provisional application No. 63/446,771, filed on Feb. 17, 2023.

(51) Int. Cl.
| | |
|---|---|
| *H02M 1/088* | (2006.01) |
| *H02M 1/00* | (2006.01) |
| *H02M 3/00* | (2006.01) |
| *H02M 3/335* | (2006.01) |
| *H03K 17/13* | (2006.01) |

(52) U.S. Cl.
CPC ......... *H02M 1/088* (2013.01); *H02M 1/0009* (2021.05); *H02M 3/01* (2021.05); *H02M 3/335* (2013.01); *H02M 3/3353* (2013.01); *H02M 3/33571* (2021.05); *H03K 17/133* (2013.01)

(58) Field of Classification Search
CPC ...... H02M 1/088; H02M 1/0009; H02M 3/01;

H02M 3/335; H02M 3/3353; H02M 3/33571; H02M 1/0029; H02M 1/0058; H02M 1/083; H03K 17/133; H03K 2017/6875; H03K 2217/0027; H03K 2217/0036
See application file for complete search history.

(56) References Cited

U.S. PATENT DOCUMENTS

| | | | | |
|---|---|---|---|---|
| 9,754,937 B1 * | 9/2017 | Lu | ......................... | H03K 17/687 |
| 10,536,087 B1 * | 1/2020 | He | ..................... | H02M 3/3376 |
| 10,622,988 B2 * | 4/2020 | Sasaki | ................... | H02M 1/088 |
| 12,095,351 B2 * | 9/2024 | Abesingha | ............ | H02M 3/158 |
| 12,525,971 B2 * | 1/2026 | Zeng | ................... | H03K 17/166 |
| 2011/0248751 A1 * | 10/2011 | Sinow | ................ | H03K 17/6871 |
| | | | | 327/109 |
| 2012/0133398 A1 * | 5/2012 | Draxelmayr | ...... | H02M 3/33571 |
| | | | | 327/109 |

(Continued)

FOREIGN PATENT DOCUMENTS

| | | |
|---|---|---|
| ES | 2453046 T3 | 4/2014 |
| WO | 2023/281998 A1 | 1/2023 |

OTHER PUBLICATIONS

Extended European Search Report received for European Patent Application No. 24157894.7, mailed on Aug. 22, 2024, 9 pages.

*Primary Examiner* — Yusef A Ahmed
(74) *Attorney, Agent, or Firm* — ArentFox Schiff LLP

(57) ABSTRACT

Detecting signals from cascode power devices is described herein. By sensing a gate signal from the high-voltage device, drain waveform characteristics may be monitored. In this manner a power switch may be controlled to avail enhanced performance in a power converter comprising a cascode power device.

21 Claims, 31 Drawing Sheets

(56)　　　　　　　References Cited

U.S. PATENT DOCUMENTS

| | | | |
|---|---|---|---|
| 2014/0300394 A1* | 10/2014 | Shiina | H03K 19/0019 |
| | | | 327/109 |
| 2015/0171750 A1* | 6/2015 | Zeng | H02M 1/08 |
| | | | 323/311 |
| 2016/0308444 A1* | 10/2016 | Hasegawa | H02M 3/01 |
| 2018/0019743 A1* | 1/2018 | Hasegawa | H03K 17/102 |
| 2019/0140631 A1* | 5/2019 | Manohar | G05F 1/595 |
| 2019/0222131 A1* | 7/2019 | King | H02M 1/088 |
| 2020/0195124 A1* | 6/2020 | Mayell | H02M 3/33507 |
| 2020/0195154 A1* | 6/2020 | Mayell | H02M 1/083 |
| 2020/0195160 A1* | 6/2020 | Mayell | H02M 3/33523 |
| 2020/0259489 A1* | 8/2020 | Pala | H10D 30/475 |
| 2022/0123647 A1* | 4/2022 | Mayell | H02M 3/3376 |
| 2022/0200459 A1* | 6/2022 | Duvnjak | H02M 3/156 |
| 2022/0208761 A1* | 6/2022 | Udrea | H10D 30/475 |
| 2022/0231684 A1* | 7/2022 | Mehrotra | H03K 17/162 |
| 2023/0010711 A1* | 1/2023 | Mayell | H02M 1/08 |
| 2024/0162898 A1* | 5/2024 | Pala | H03K 17/567 |
| 2024/0178831 A1* | 5/2024 | Qu | H02M 1/08 |
| 2025/0174976 A1* | 5/2025 | Han | H02H 7/20 |
| 2025/0202478 A1* | 6/2025 | Serra | H03K 17/687 |

* cited by examiner

TO FIG. 5B

FROM FIG. 5A

TO FIG. 7B

FROM FIG. 7A

FROM FIG. 11A

DETECTING SIGNALS FROM CASCODE POWER DEVICES

CROSS-REFERENCE TO RELATED APPLICATIONS

This application claims the benefit of U.S. Provisional Application No. 63/446,771 filed on Feb. 17, 2023, and Provisional Application No. 63/504,384 filed on May 25, 2023, incorporated by reference in their entirety.

FIELD OF DISCLOSURE

The present invention relates generally to detecting signals in power converters, and more specifically to detecting signals from cascode power devices in power converters.

BACKGROUND INFORMATION

Due to their high efficiency, small size, and low weight, switched mode power converters are often used in powering today's electronics from conventional wall sockets. According to switch-mode power-converter practice, high-voltage alternating-current (ac) input is converted into a well-regulated direct-current (dc) output through an energy transfer element (e.g., a transformer). The switched mode power converter controller usually provides output regulation by sensing one or more inputs representative of one or more output quantities and controlling the output in a closed loop. In operation, a switch is utilized to provide the desired output by varying the duty cycle (typically the ratio of the on time of the switch to the total switching period), varying the switching frequency, or varying the number of pulses per unit time of the switch in a switched mode power converter.

One type of switch mode power converter is a resonant converter, which includes a resonant circuit (e.g., inductor(s) and capacitor(s)) as part of a power stage. A resonant circuit may advantageously enhance power conversion efficiency by availing zero-current and/or zero-voltage switching.

A subset of resonant converters, the series inductor-inductor capacitor (LLC) converter, uses a resonant circuit with two inductors and one capacitor connected in series to form an LLC resonant circuit. Commonly, the power stage of an LLC converter is controlled so that power stage switches (e.g., high-side, and low-side devices) undergo zero-voltage switching (ZVS).

BRIEF DESCRIPTION OF THE DRAWINGS

Non-limiting and non-exhaustive embodiments of detecting signals from cascode power devices are described with reference to the following figures, wherein like reference numerals refer to like parts throughout the various views unless otherwise specified.

Figure 1A:
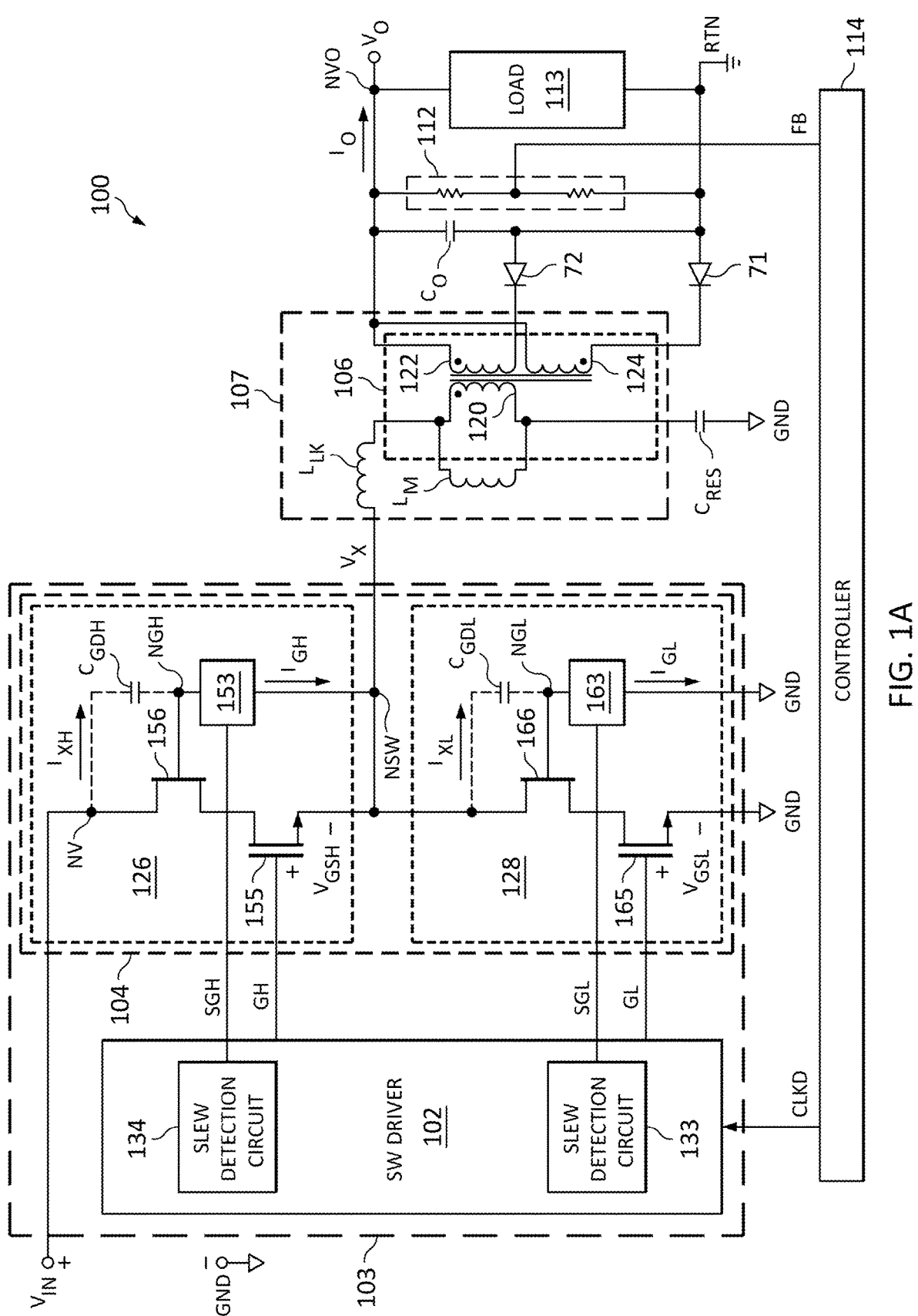
FIG. 1A illustrates a (half bridge LLC) power converter including slew detection circuits according to the teachings herein.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of detecting signals from cascode power devices. Also, common but well-understood elements that are useful or necessary in a commercially feasible embodiment are often not depicted in order to facilitate a less obstructed view of these various embodiments of the teachings herein.

DETAILED DESCRIPTION

In the following description, numerous specific details are set forth in order to provide a thorough understanding of detecting signals from cascode power devices. It will be apparent, however, to one having ordinary skill in the art that the specific detail need not be employed to practice the teachings herein. In other instances, well-known materials, components, and/or methods have not been described in detail in order to avoid obscuring the present disclosure.

Reference throughout this specification to "one embodiment," "an embodiment," "one example" or "an example" means that a particular feature, structure, or characteristic described in connection with the embodiment or example is included in at least one embodiment of the present invention. Thus, appearances of the phrases "in one embodiment," "in an embodiment," "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, in one embodiment, a high-voltage transistor comprises an N-channel field-effect transistor (FET); the N-channel field-effect transistor (FET) may be a metal oxide semiconductor field effect transistor (MOSFET) with the high-voltage being supported between the first terminal, a drain, and the second terminal, a source. In another embodiment the field-effect transistor (FET) may be a junction field effect transistor (JFET), a depletion-mode device whereby transport is predominantly by majority carriers. As one of ordinary skill in the art may appreciate, a FET may be realized using materials such as silicon (Si), silicon carbide (SiC), gallium nitride (GaN), and the like. For instance, a FET may be a gallium nitride (GaN) FET and/or a GaN High Electron Mobility Transport (HEMT) FET device.

In some embodiments an integrated controller circuit may be used to drive a power switch when regulating energy provided to a load.

Also, for purposes of this disclosure, "ground" or "ground potential" refers to a reference voltage or potential against which all other voltages or potentials of an electronic circuit or Integrated circuit (IC) are defined or measured.

As described above one type of switched mode power converter is a resonant converter which uses a resonant circuit, also referred to as a resonant network or "tank" circuit, having inductance(s) and capacitance(s) as part of the power conversion process. Resonant converters may have some advantages compared to non-resonant switched mode power converters, such as soft switching (e.g., zero-voltage switching), generally higher efficiency, lower losses at higher frequency operation, and lower harmonic content in switching waveforms. These in turn can reduce packaging and component costs by allowing the use of smaller magnetic elements and smaller electromagnetic interference (EMI) filters.

Resonant converters often include a half-bridge circuit. The half-bridge circuit may include a low-side device (i.e., a low-side switch) and a high-side device (i.e., a high-side switch). During operation, the low-side device and high-side device may switch on and off according to a switching cycle. Additionally, as described herein, a switching cycle may include a deadtime whereby both the low-side device and high-side device remain off. For instance, there may be a break-before-make period (i.e., a deadtime) to mitigate shoot-through current. According to the teachings herein, during a break-before-make period (i.e., a deadtime) a switch-node voltage may decrease and/or increase (i.e., may "slew"). As one of ordinary skill in the art may appreciate, break-before-make (BBM) relates to a switch configuration which prevents momentary connection of a first and second circuit path. During break-before-make operation, a switch may break (open) a first circuit path before connecting the second circuit path.

Applications may include any ZVS converter topology such as an LLC converter.

Also, according to the teachings herein, zero-voltage switching (ZVS) may be implemented by controlling the deadtime so that either the high-side or low-side device turns-on when the rate-of-change of the switch-node voltage decreases to zero (i.e., at the "end-of-slew"). Accordingly, it is desirable to monitor the "slew" and/or "slew rate" of the switch-node voltage so that deadtime may be controlled. In this manner ZVS may be implemented.

Modern power converters, including resonant converters, often use cascode power devices. A cascode power device may include an enhancement mode device (e.g., an enhancement mode n-channel field effect transistor) connected in cascode with a high-voltage depletion mode device (e.g., a high-voltage gallium nitride (GaN) and/or silicon carbide (SiC) field effect transistor). An enhancement mode device may often be referred to as a "normally off" device, and the depletion mode device may be referred to as a "normally on" device.

Accordingly, there is a need for monitoring slew in power converters using cascode power devices.

Detecting signals from cascode power devices is described herein. By sensing a slew current from the high-voltage device, slew and end-of-slew may be monitored. In this manner deadtime may be controlled to avail zero-voltage switching in a power converter comprising a cascode power device.

FIG. 1A illustrates a (half bridge LLC) power converter 100 including slew detection circuits 133-134 according to the teachings herein.

The power converter 100 may be configured as a half bridge LLC power converter 100; accordingly, it may also be referred to as a half bridge LLC power converter 100 without departing from the scope of the present disclosure.

As illustrated, power converter 100 includes a primary bridge circuit 103, a resonant transformer 107, a resonant capacitor $C_{RES}$, rectifiers 71 and 72, an output capacitor Co, a feedback network 112, and a controller 114. The primary bridge circuit 103 includes a switch driver 102 and a half bridge 104. Additionally, the half bridge 104 includes a high-side (HS) cascode power device 126 and a low-side (LS) cascode power device 128. Also, the resonant transformer 107 includes a transformer 106, a leakage inductor $L_{LK}$, and a magnetizing inductor $L_M$.

As illustrated, a direct current (dc) input voltage $V_{IN}$, referenced to ground GND, may be applied at a primary input (i.e., primary supply node NV) of power converter 100. Power converter 100 may convert input power from the primary input into dc output power. The dc output power may be delivered to the load 113 with a regulated output voltage $V_O$, referenced to a secondary ground RTN, and with output current $I_O$.

The leakage inductor $L_{LK}$, the magnetizing inductor $L_M$, and the resonant capacitor $C_{RES}$ are connected in series between a switch node NSW and ground GND. The controller 114 may provide a drive signal CLKD to the switch driver 102, which in response, may provide a gate drive signal GH to the HS cascode power device 126 and a gate drive signal GL to the LS cascode power device 128.

Gate drive signals GH and GL may respectively drive the HS cascode power device 126 and LS cascode power device 128 to generate a switch node voltage $V_X$ at switch node NSW. In turn, the switch node voltage $V_X$ may drive the resonant transformer 107.

During operation, the transformer 106 may provide galvanic isolation between the primary side and the secondary side of power converter 100; in this way, signals on the primary side, referenced to ground GND, may be isolated from signals on the secondary side, referenced to a secondary ground RTN.

As illustrated, the primary winding 120 is electrically coupled in parallel with the magnetizing inductor $L_M$ so that the in-phase winding terminal, as indicated by the dot (i.e., the dot terminal), connects to the leakage inductor $L_{LK}$. The secondary winding 122 is electrically connected in series with the rectifier 72 between the secondary ground RTN and the secondary output (i.e., secondary output node NVO) and the in-phase winding terminal connects to the secondary output node NVO. The secondary winding 124 is electrically connected in series with the rectifier 71 between the secondary ground RTN and the secondary output node NVO and the in-phase winding terminal connects to the cathode of rectifier 71.

Additionally, the anodes of rectifiers 71 and 72 both connect to the secondary ground RTN; and the output capacitor $C_O$ and the feedback network 112 are electrically coupled in parallel with the load 113 between the secondary output (i.e., secondary output node NVO) and secondary ground RTN. As illustrated, the controller 114 may provide drive signal CLKD based, at least in part, upon the feedback signal FB from the feedback network 112.

High side (HS) cascode power device 126 includes a first (lower) n-channel field effect transistor (NFET) 155 electrically coupled in cascode with a second (upper) NFET 156. Thus, the source of first (lower) NFET 155 may be electrically coupled to the switch node NSW. The drain of first (lower) NFET 155 may be electrically coupled to the source of second (upper) NFET 156; and the drain of second (upper) NFET 156 may be electrically coupled to primary supply node NV.

The first (lower) NFET 155 may be an enhancement mode NFET and the second (upper) NFET 156 may be a depletion mode NFET. For instance, the first (lower) NFET 155 may be a lateral and/or vertical enhancement mode NFET with a threshold voltage greater than zero; and the second (upper) NFET 156 may be a gallium nitride (GaN) depletion mode power device capable of sustaining a high drain-to-source voltage (e.g., several hundred volts or greater). Accordingly, the gate of first (lower) NFET 155 may be electrically coupled to switch driver 102 to receive gate drive signal GH; and a gate of second (upper) NFET 156 may be electrically coupled to the source of the first (lower) NFET 155. Also, as illustrated, the source of the second (upper) NFET 156 may be electrically coupled to the drain of the first (lower) NFET 155. The source of first (lower) NFET 155 may be coupled to the switch node NSW.

Low side (LS) cascode power device 128 includes a first (lower) n-channel field effect transistor (NFET) 165 electrically coupled in cascode with a second (upper) NFET 166. Thus, the source of first (lower) NFET 165 may be electrically coupled to ground GND. The drain of first (lower) NFET 165 may be electrically coupled to the source of second (upper) NFET 166; and the drain of second (upper) NFET 166 may be electrically coupled to the switch node NSW. Also, as illustrated, the gate of the second (upper) NFET 166 may be electrically coupled to ground (GND) via the current sense element 163.

The first (lower) NFET 165 may be an enhancement mode NFET and the second (upper) NFET 166 may be a depletion mode NFET. For instance, the first (lower) NFET 165 may be a lateral and/or vertical enhancement mode NFET with a threshold voltage greater than zero; and the second (upper) NFET 166 may be a gallium nitride (GaN) depletion mode power device capable of sustaining a high drain-to-source voltage (e.g., one-thousand or greater volts). Accordingly, the gate of first (lower) NFET 165 may be electrically coupled to switch driver 102 to receive gate drive signal GL; and a gate of second (upper) NFET 166 may be electrically coupled to the source of the first (lower) NFET 165.

During slew, the switch node voltage $V_X$ may vary and give rise to displacement current in coupled capacitive elements (coupled capacitance). For instance, a time rate of change of the switch node voltage $V_X$ (e.g., a slew rate of switch node voltage $V_X$) may give rise to a displacement current $I_{XH}$ (i.e., a slew current $I_{XH}$) in a capacitance $C_{GDH}$ coupled between primary supply node NV and gate node NGH. Alternatively, and additionally, the time rate of change of the switch node voltage $V_X$ may also give rise to a displacement current $I_{XL}$ (i.e., a slew current $I_{XL}$) in a capacitance $C_{GDL}$ coupled between the switch node NSW and gate node NGL. Capacitance $C_{GDL}$ may be a parasitic capacitance of an NFET (e.g., the second (upper) NFET 156), an external capacitance, and/or a combination of both.

According to the teachings herein, the switch driver 102 may provide gate drive signals GH and GL so that the HS cascode power device 126 and the LS cascode power device 128 undergo zero-voltage switching. To effect ZVS, the switch driver 102 may include one or more slew detection circuits 133, 134 and current sense elements 153, 163.

For instance, current sense element 153 may be electrically coupled between gate node NGH and switch node NSW to sense node gate current $I_{GH}$, which may comprise slew current $I_{XH}$. Node gate current $I_{GH}$ may be current from gate node NGH. Accordingly, current sense element 153 may detect and/or monitor slew current $I_{XH}$ by providing sense signal SGH in response to node gate current $I_{GH}$. As described herein, slew detection circuit 134 may, in turn, provide information to the switch driver 102 to control one or more of the gate drive signals GH, GL. As one of ordinary skill in the art may appreciate, sense signal SGH may be a current, voltage, and/or a power signal. For instance, the current sense element 153 may be realized using a current mirror, and sense signal SGH may be a current derived from the current mirror.

Similarly, current sense element 163 may be electrically coupled between gate node NGL and ground GND to sense node gate current $I_{GL}$, which may comprise slew current $I_{XL}$. Node gate current $I_{GL}$ may be current from gate node NGL. Accordingly, current sense element 163 may detect and/or monitor slew current $I_{XL}$ by providing sense signal SGL in response to node gate current $I_{GL}$. As described herein, slew detection circuit 133 may, in turn, provide information to the switch driver 102 to control one or more of the gate drive signals GH, GL. As one of ordinary skill in the art may appreciate, sense signal SGL may also be a current, voltage, and/or a power signal. For instance, the current sense element 163 may be realized using a current mirror, and sense signal SGL may be a current derived from the current mirror.

In one aspect a gate of an upper cascode MOSFET/switch may be grounded directly and/or indirectly via a resistive element (e.g., a resistor and/or resistance).

The teachings herein may apply where the gate of the upper cascode switch is coupled (i.e., electrically coupled) to ground and/or to a local ground (e.g., a half-bridge switch node NSW).

Figure 1B:
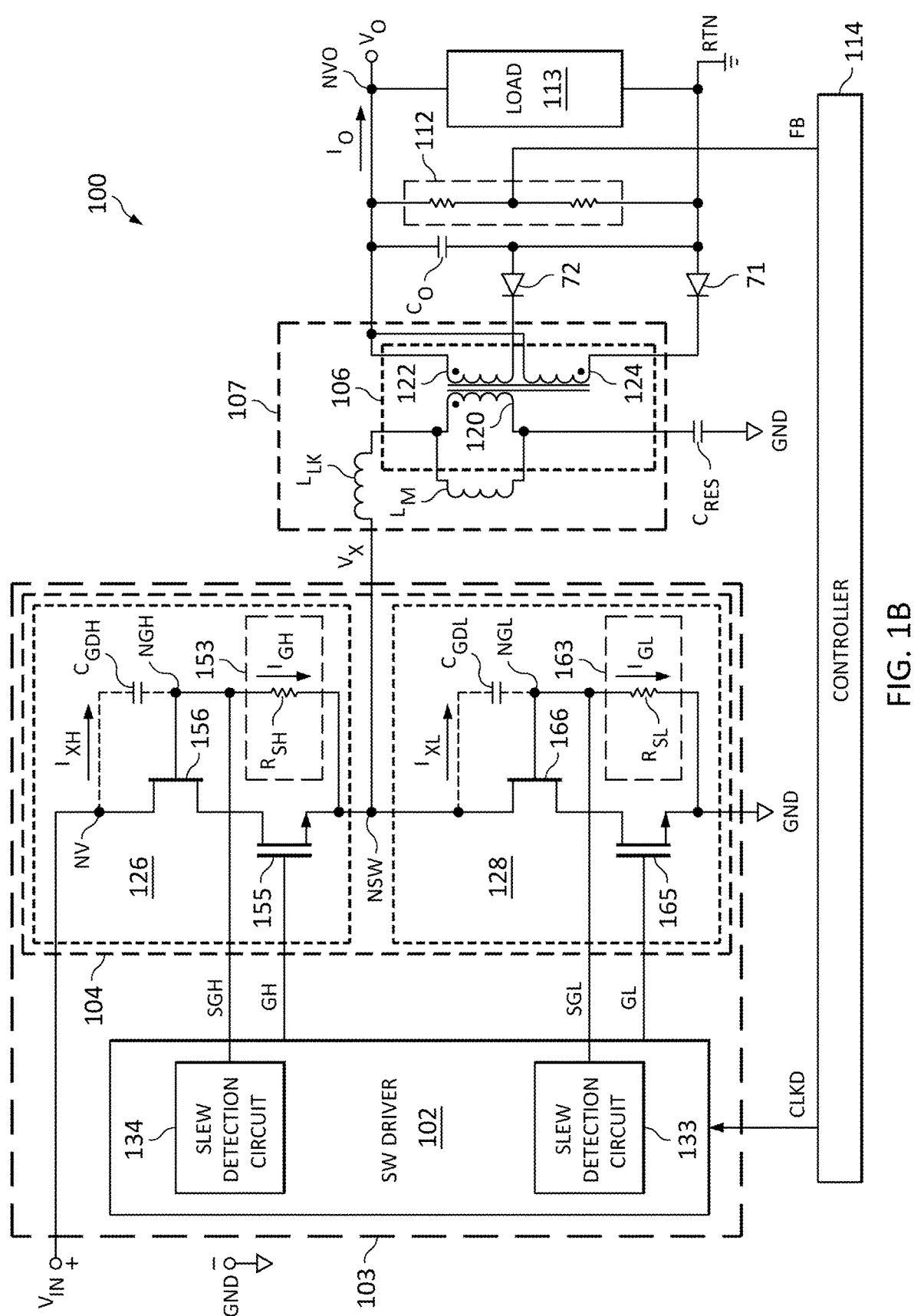
FIG. 1B illustrates a (half bridge LLC) power converter including slew detection circuits according to an embodiment.

FIG. 1B illustrates a (half bridge LLC) power converter 100 including slew detection circuits 133-134 according to an embodiment. In the embodiment of FIG. 1B, current sense element 153 is realized using a resistance $R_{SH}$, and current sense element 163 is realized using a resistance $R_{SL}$. Resistance $R_{SH}$ and resistance $R_{SL}$ may be realized using resistive elements (e.g., resistors). Furthermore, resistive elements (e.g., resistors) may be external and/or integrated. For instance, resistance $R_{SH}$ and resistance $R_{SL}$ may be realized using integrated polysilicon resistors. Alternatively, and additionally, resistance $R_{SH}$ and resistance $R_{SL}$ may be realized using components external to the primary bridge circuit 103. In one embodiment resistance $R_{SH}$ and resistance $R_{SL}$ may have values between one-tenth of an ohm (0.1 ohms) and one-hundred ohms (100 ohms). Alternatively, and additionally, resistance $R_{SH}$ and resistance $R_{SL}$ may comprise inherent (e.g., parasitic) interconnect resistance.

Figure 1C:
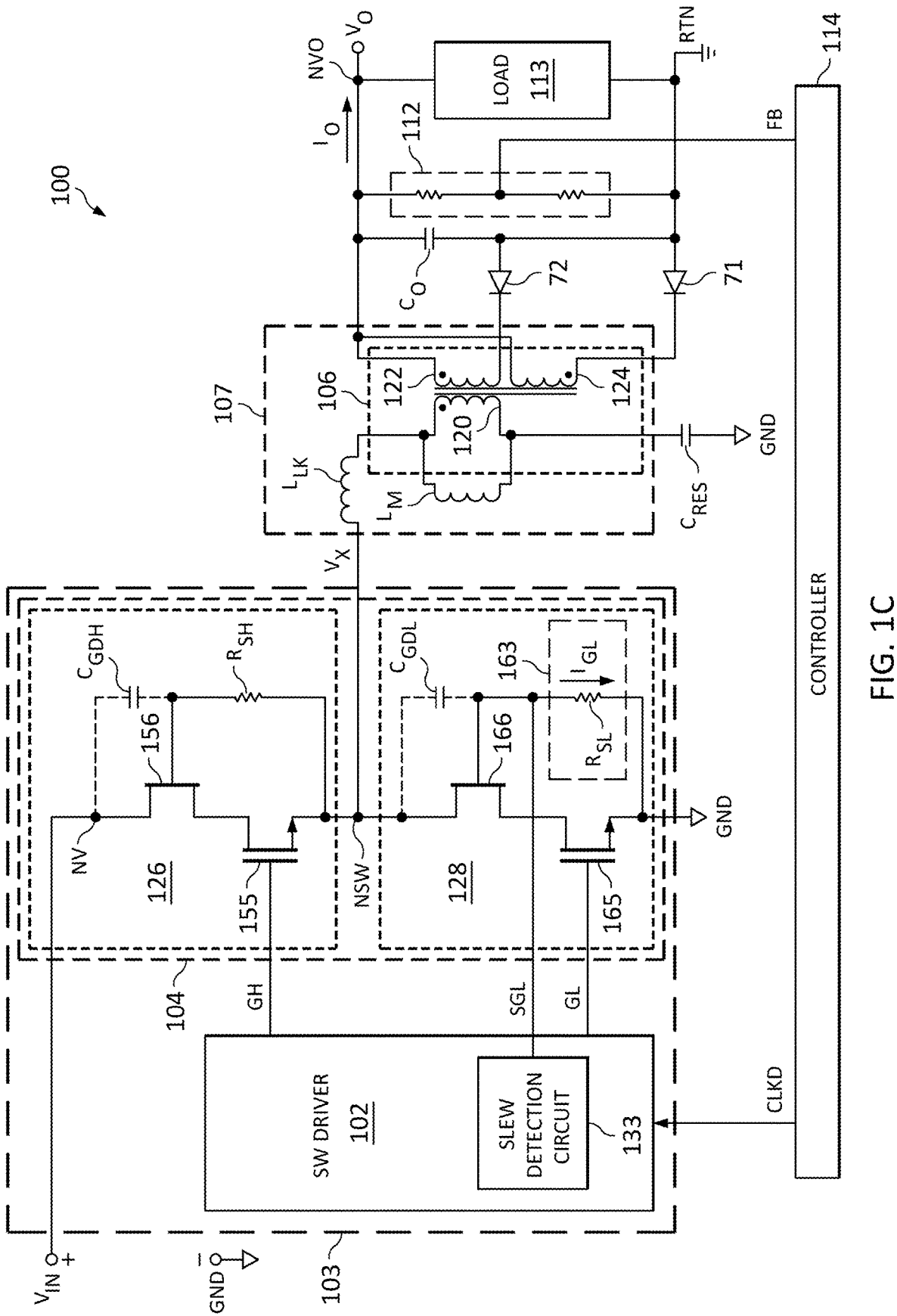
FIG. 1C illustrates a (half bridge LLC) power converter including a slew detection circuit according to an embodiment.

FIG. 1C illustrates a (half bridge LLC) power converter 100 including a slew detection circuit 133 according to an embodiment. The embodiment of FIG. 1C is like that of FIG. 1B, except it excludes slew detection circuit 134.

Figure 1D:
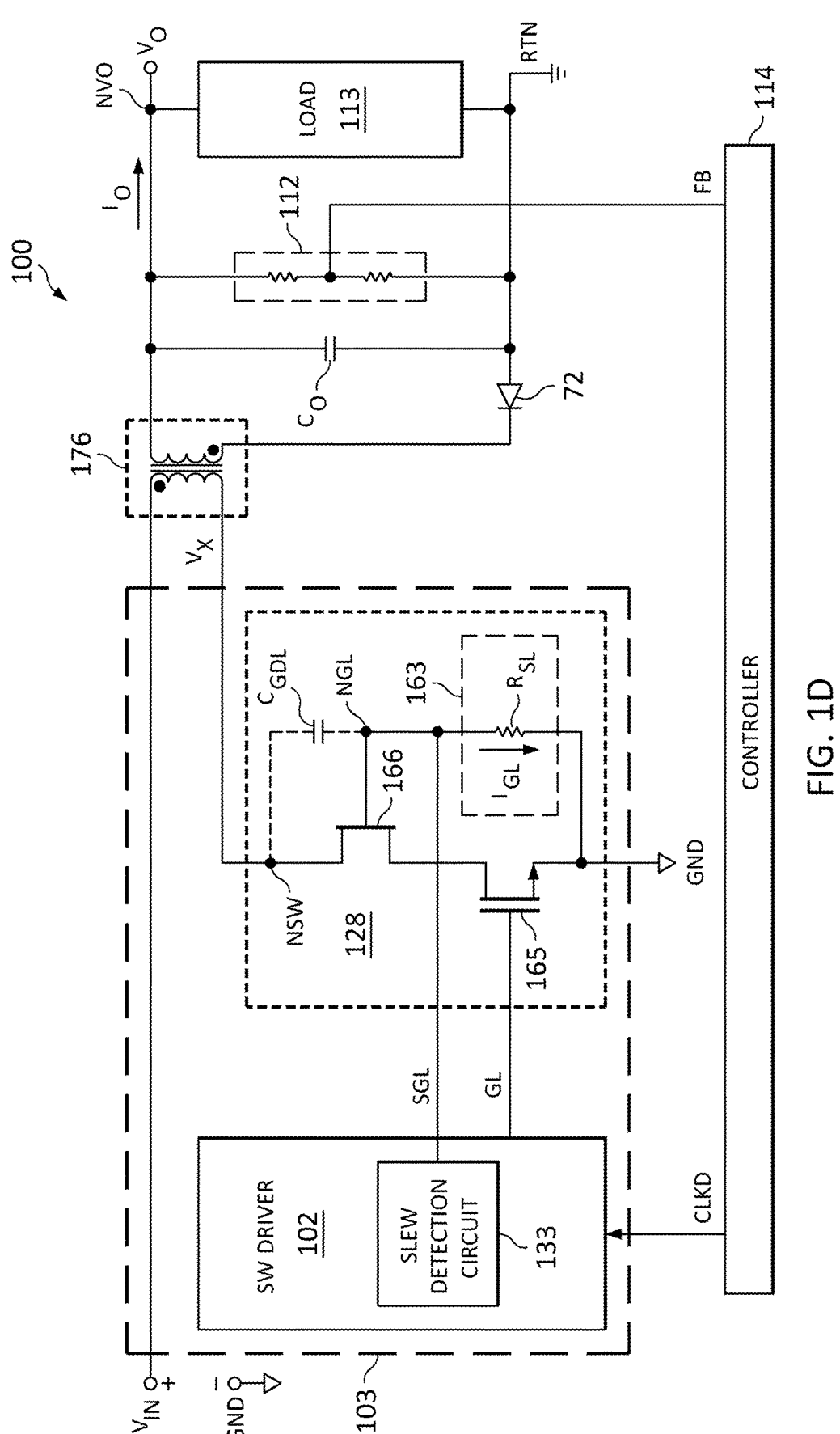
FIG. 1D illustrates a flyback power converter including a slew detection circuit according to an embodiment.

FIG. 1D illustrates a power converter 100 including a slew detection circuit according to an embodiment. The embodiment of FIG. 1D is like that of FIG. 1C except it uses a flyback configuration, and therefore may operate as a flyback converter. Thus, power converter 100 of FIG. 1D may also be referred to as a flyback power converter 100 without departing from the scope of the present disclosure. Accordingly, flyback power converter 100 may include an energy transfer element 176 and may exclude a HS cascode power device 126.

Figure 2A:
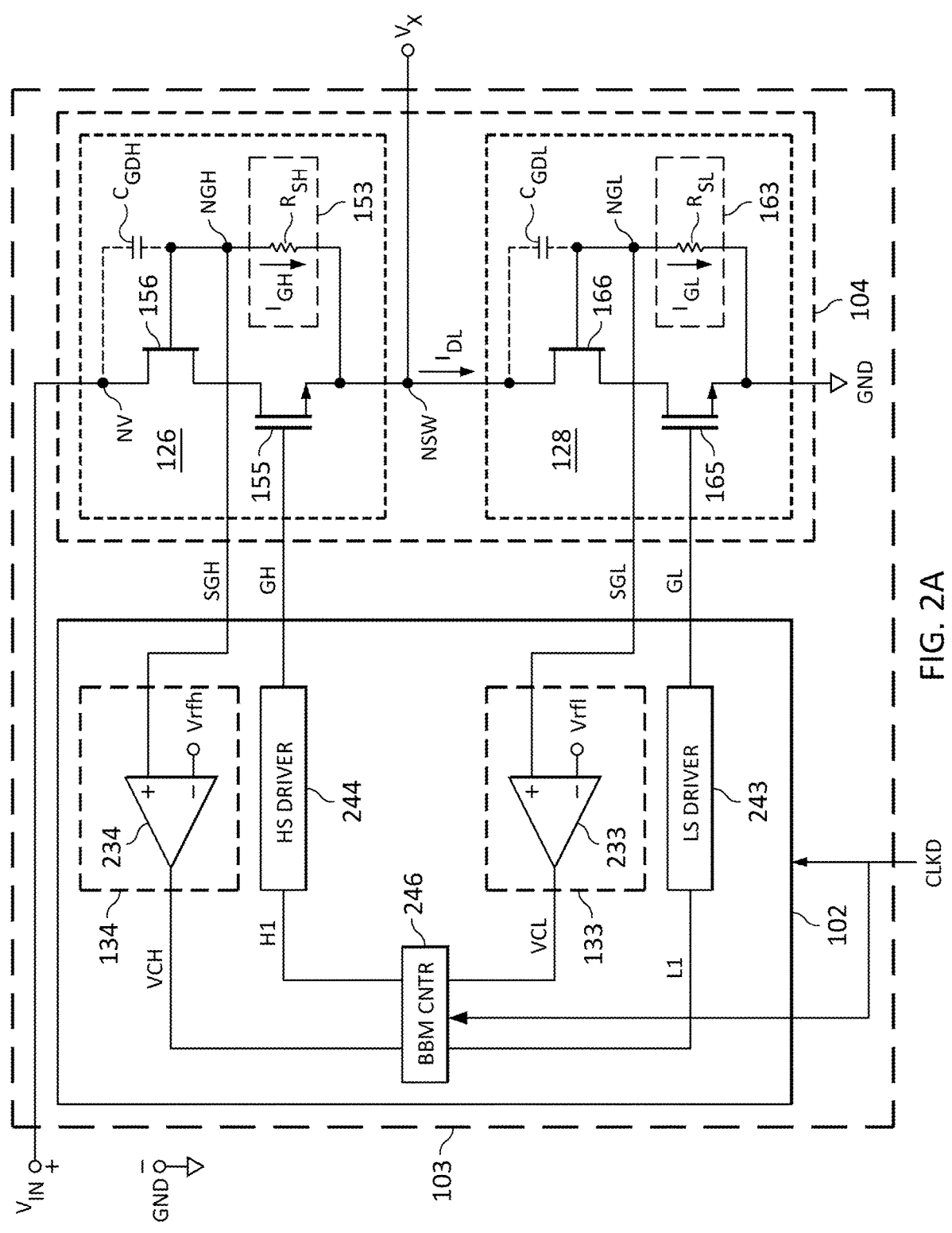
FIG. 2A illustrates a primary bridge circuit according to an embodiment.

FIG. 2A illustrates a primary bridge circuit 103 according to an embodiment. The primary bridge circuit 103 includes switch driver 102 and half bridge 104. Like that of FIG. 1B, half bridge 104 of FIG. 2A includes a HS cascode power device 126 and a LS cascode power device 128; and like that of FIG. 1B, current sense element 153 is realized using a resistance $R_{SH}$, and current sense element 163 is realized using a resistance $R_{SL}$.

Switch driver 102 includes a low side (LS) driver 243, a high side (HS) driver 244, a break-before-make (BBM) controller 246, slew detection circuit 133, and slew detection circuit 134. As illustrated BBM controller 246 may provide signal L1 to the LS driver 243 and signal H1 to the HS driver 244. In turn LS driver 243 may provide gate drive signal GL in response to receiving signal L1; and HS driver 244 may provide gate drive signal GH in response to receiving signal H1. Accordingly, the turn-on and turn-off control (e.g., "make" and "break" control) of the HS cascode power device 126 and LS cascode power device 128, may be determined, at least in part, by the BBM controller 246. According to the teachings herein, the BBM controller 248 may avail break-before-make operation by providing signals L1 and H1 based, at least in part, upon the drive signal CLKD and upon state signals VCL, VCH.

As illustrated, the BBM controller 246 may receive a drive signal CLKD (e.g., drive signal CLKD from controller 114); and under various operating conditions (e.g., steady state operating conditions) drive signal CLKD may be periodic and/or switch according to a switching cycle.

Additionally, during a switching cycle, drive signal CLKD may undergo edge transitions. For instance, drive signal CLKD may exhibit a rising edge (low-to-high) at the start of a switching cycle and a falling edge (high-to-low) in accordance with its duty cycle.

Also, the switching cycle and duty cycle of the switch node voltage $V_X$ may be determined, at least in part, by the switching cycle and/or duty cycle of drive signal CLKD. Therefore, slew of switch node voltage $V_X$ may also be associated with edge transitions of drive signal CLKD.

Accordingly, the BBM controller 246 may use this information (i.e., an edge transition of drive signal CLKD) to initiate "break" coincident with the onset of slew. In response to an edge transition of drive signal CLKD, the BBM controller 246 may provide signals L1 and H1 to turn off both the HS cascode power device 126 and LS cascode power device 128. For instance, at the beginning of a switching cycle, the drive signal CLKD may exhibit a rising edge; and in response, the BBM controller 246 may initiate "break" by providing signals L1 and H1 so that both the HS cascode power device 126 and LS cascode power device 128 are off.

Also, during a switching cycle, the switch node voltage $V_X$ may exhibit slew such that when the switch node voltage is decreasing, the slew is negative (i.e., exhibits negative slew); and when the switch node voltage is increasing, the slew is positive (i.e., exhibits positive slew).

As described herein, the BBM controller 246 may further receive state signals VCL, VCH indicating a slew state (e.g., start of slew, negative slew, positive slew, or the end-of-slew). In response to one or more of the state signals VCL, VCH, the BBM controller 246 may provide signals L1 and H1 to either "make" and/or to sustain "break". For instance, BBM controller 246 may sustain "break" by providing signals L1 and H1 so that the HS cascode power device 126 and the LS cascode power device 128 remain off during slew. Additionally, the BBM controller 246 may initiate "make" by providing signals L1 and H1 so that a select one of the HS cascode power device 126 and the LS cascode power device 128 turns on.

As illustrated, state signal VCL may be provided from slew detection circuit 133 in response to sense signal SGL. Slew detection circuit 133 comprises comparator 233. Comparator 233 may receive a reference voltage Virfl at its inverting input and sense signal SGL at its noninverting input. Therefore, comparator 233 may provide state signal VCL in response to the comparison of sense signal SGL with reference voltage Virf1. For instance, as discussed with regards to the waveforms of FIG. 3, state signal VCL may be exerted high during positive slew and exhibit an edge transition (e.g., a falling edge) at the end-of-slew. Accordingly, the BBM controller 246 may, in response to state signal VCL, sustain "break" while state signal VCL is exerted high and initiate "make" at the end-of-slew.

Similarly, state signal VCH may be provided from slew detection circuit 134 in response to sense signal SGH. Slew detection circuit 134 comprises comparator 234. Comparator 234 may receive a reference voltage Vrfh at its inverting input and sense signal SGH at its noninverting input. Therefore, comparator 234 may provide state signal VCH in response to the comparison of sense signal SGH with reference voltage Vrfh. For instance, state signal VCH may be exerted high during negative slew and exhibit an edge transition (e.g., a falling edge) at the end-of-slew. Accordingly, the BBM controller 246 may, in response to state signal VCH, sustain "break" while state signal VCH is exerted high and initiate "make" at the end-of-slew.

Although FIG. 2A illustrates a configuration wherein the BBM controller 246 avails break-before-make based upon state signals VCL, VCH, and drive signal CLKD, other configurations are possible.

Figure 2B:
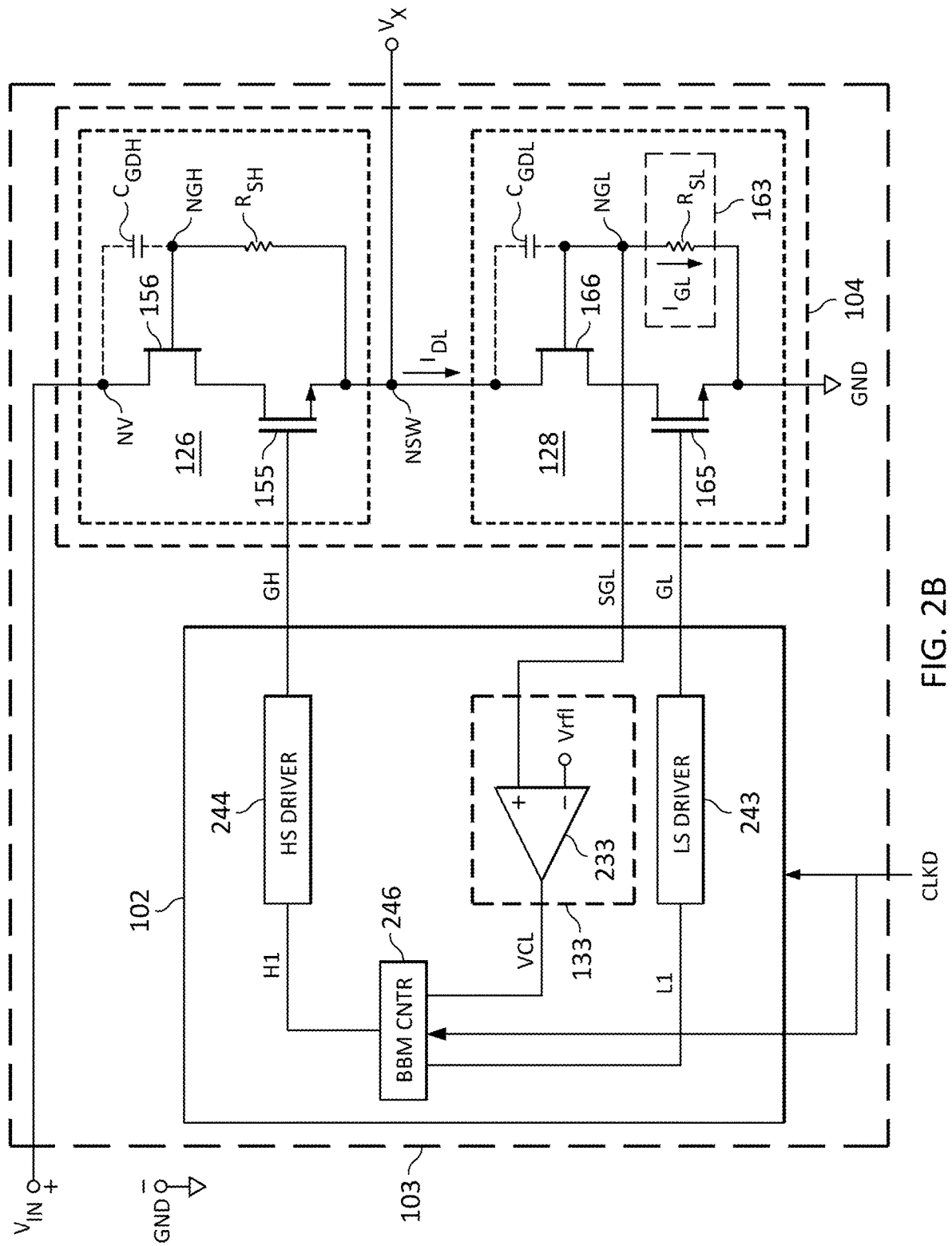
FIG. 2B illustrates a primary bridge circuit according to an embodiment.

For instance, FIG. 2B illustrates a primary bridge circuit 103 according to another embodiment. Half bridge 104 of FIG. 2B is like that of FIG. 1C except it may use fewer components by excluding slew detection circuit 134. Therefore, the BBM controller 224 of FIG. 2B may control "make" and "break" without necessitating state signal VCH of FIG. 2A.

Figure 2C:
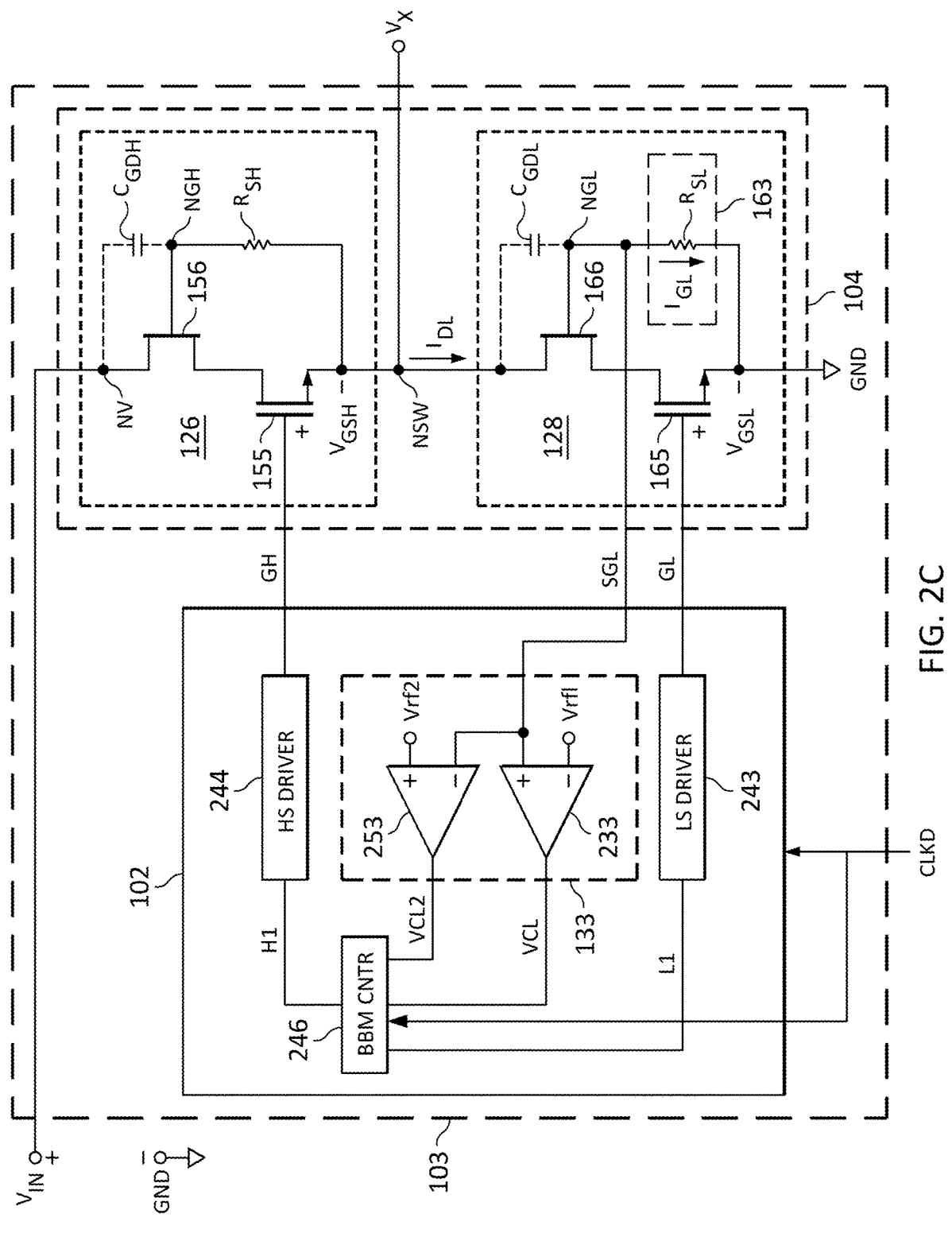
FIG. 2C illustrates a primary bridge circuit according to an embodiment.

FIG. 2C illustrates a primary bridge circuit 103 according to another embodiment. Switch driver 102 of FIG. 2C is like that of FIG. 2B, except slew detection circuit 133 includes an additional comparator 253. Comparator 253 receives sense signal SGL at its inverting terminal and a reference voltage Vrf2 at its noninverting terminal. In this way comparator 253 may provide an additional state signal VCL2 which may transition high during a negative slew event. For instance, when the switch node voltage $V_X$ increases with positive slew, comparator 233 may exert state signal VCL high; and when the switch node voltage $V_X$ decreases with negative slew, comparator 253 may exert state signal VCL2 high.

Figure 2D:
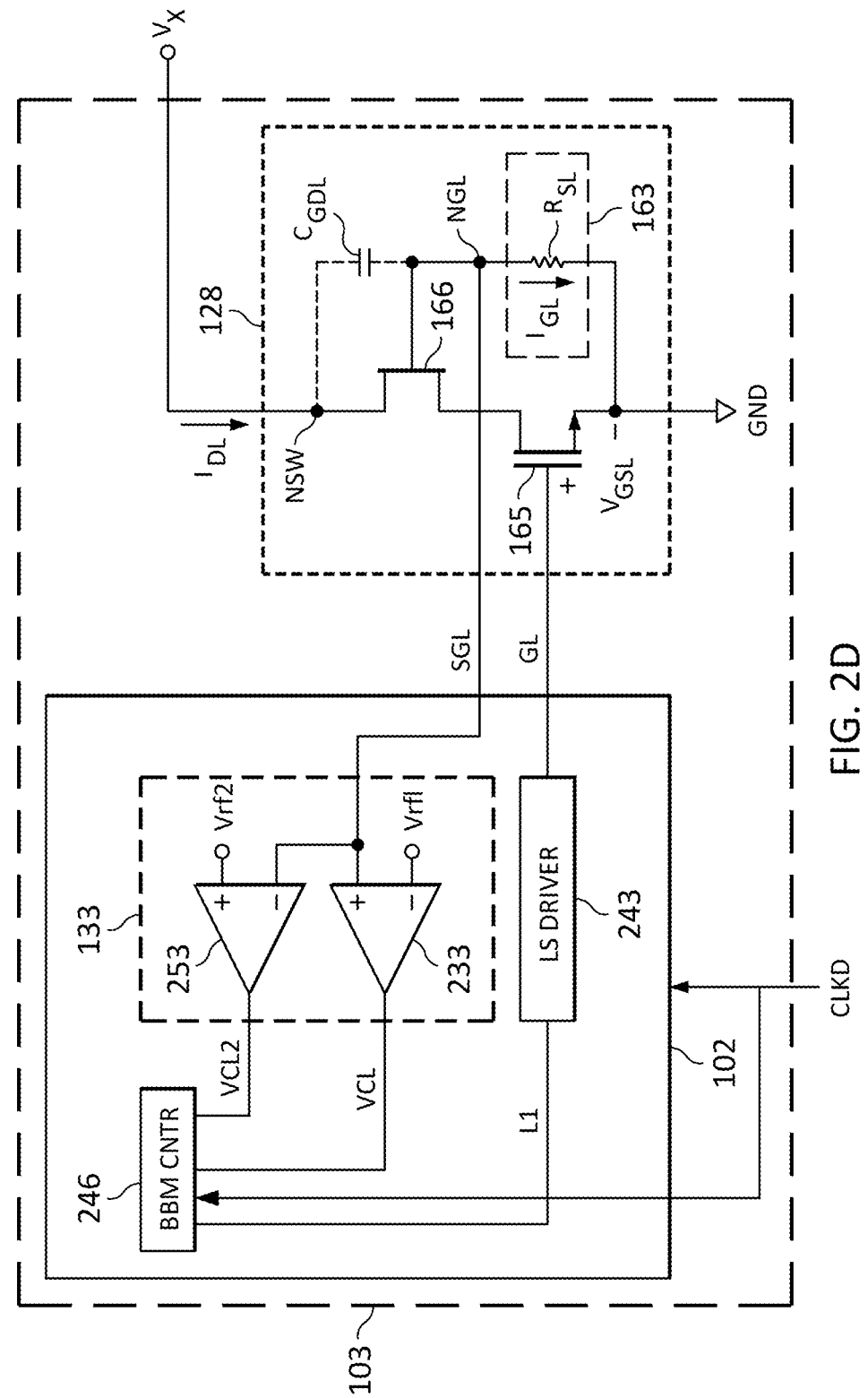
FIG. 2D illustrates a primary bridge circuit according to an embodiment.

FIG. 2D illustrates a primary bridge circuit 103 according to an embodiment. Primary bridge circuit 103 of FIG. 2D is like that of FIG. 2C except it excludes HS cascode power device 126 and HS driver 244. Therefore, like that of FIG. 1D, the primary bridge circuit 103 may be representative of that used in a flyback configuration.

Although FIG. 2A-FIG. 2D illustrate slew detection circuits 133, 134 as comprising voltage comparators 233, 234; other configurations are possible. For instance, with reference to FIG. 1A, one or more of the sense signals SGL, SGH may be a current. Accordingly, the slew detection circuits 133, 134 may alternatively, and additionally, include current comparators to compare one or more of the sense signals SGL, SGH with a reference current.

Figure 2E:
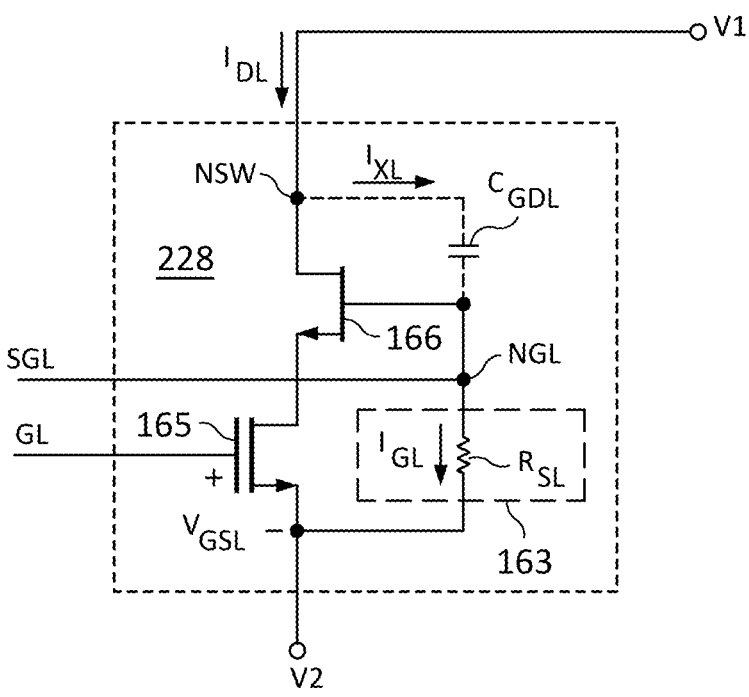
FIG. 2E illustrates a cascode power device according to an embodiment.

FIG. 2E illustrates a cascode power device 228 according to an embodiment. Cascode power device 228 includes a first (lower) n-channel field effect transistor (NFET) 165 electrically coupled in cascode with a second (upper) NFET 166. Cascode power device 228 is like cascode power device 128 except the source of first (lower) NFET 165 receives voltage V2 instead of ground GND; and the drain of the second (upper) NFET 166 receives voltage V1 instead of switch node voltage $V_X$.

During operation, voltage V2 may be less than voltage V1 such that the difference of voltage V1 and voltage V2 (i.e., the voltage difference (V1-V2)) is greater than or equal to zero volts. For instance, voltage V2 may be ground GND (zero volts) and voltage V1 may be a positive voltage (e.g., one-thousand volts). Accordingly, the discussion and operation of cascode power device 228 may be like that of cascode power device 128 except for the presence of voltages V2 and V1.

Accordingly, the voltage difference of voltage V1 and voltage V2 (i.e., the voltage difference (V1-V2)) may give rise to displacement current $I_{XL}$ due, at least in part, to capacitance $C_{GDL}$ coupled between the switch node NSW and gate node NGL.

Figure 3A:
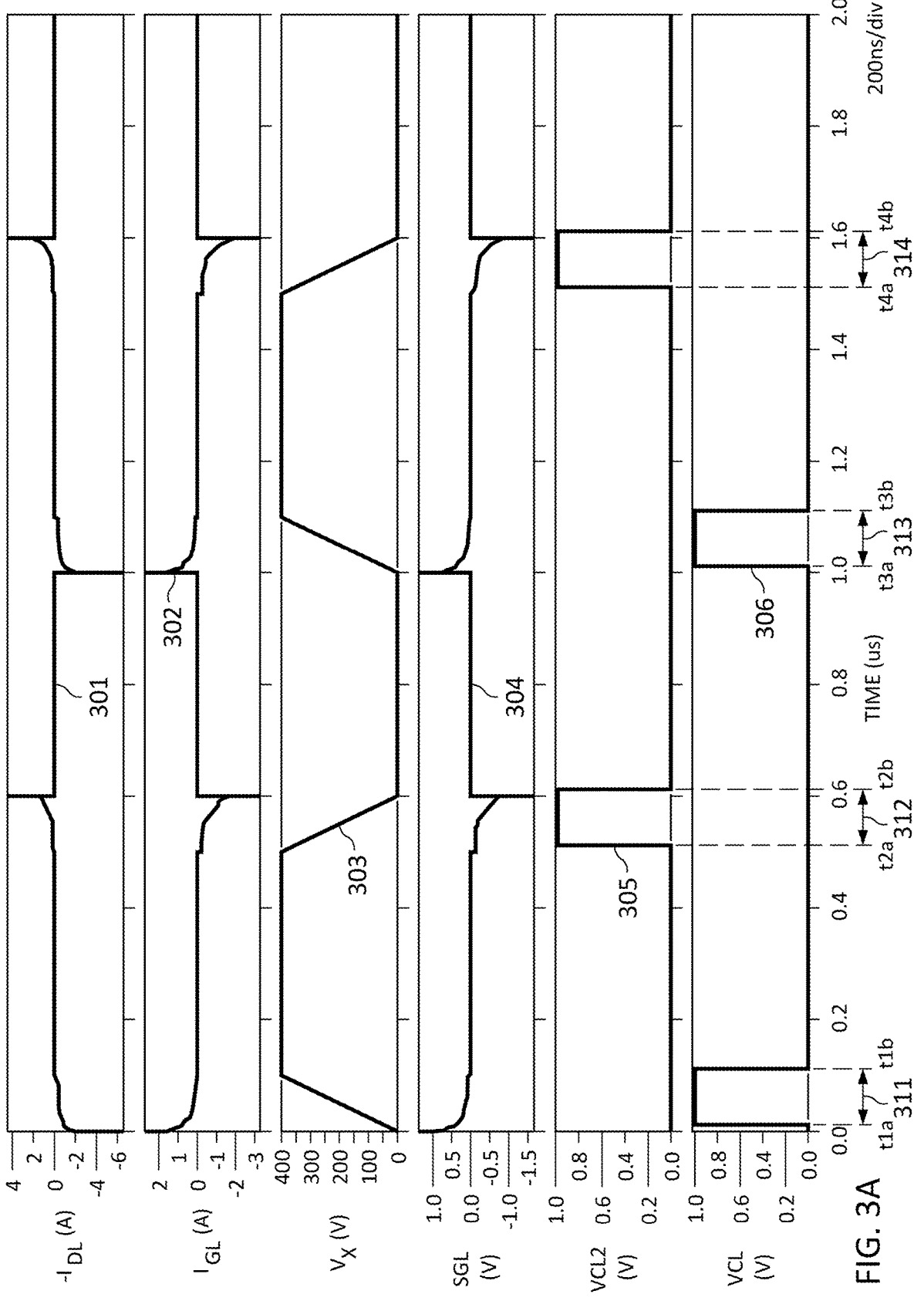
FIG. 3A illustrates waveforms according to the teachings herein.

FIG. 3A illustrates waveforms 301-306 according to the teachings herein. With reference to FIG. 2C and/or FIG. 2D, waveform 301 may correspond with device current $I_{DL}$ at switch node NSW and have units of amps (A). Waveform 302 may correspond with gate current $I_{GL}$ in units of amps (A). Waveform 303 may correspond with switch node voltage $V_X$ in units of volts (V). Waveform 304 may correspond with sense signal SGL in units of volts (V). Waveform 305 may correspond with state signal VCL2 in units of volts (V); and waveform 306 may correspond with state signal VCL in units of volts (V).

As illustrated, from time equal to zero microseconds (0.0 us) to zero point one microseconds (0.1 us) the switch node voltage $V_X$ slews positive from zero volts (0.0V) to four-hundred volts (400V). In response to the positive slew event, waveform 301 indicates that device current $I_{DL}$ flows from the switch node NSW to the LS device 128. Waveform 302 indicates that a positive, nonzero gate current $I_{GL}$ may be present concurrently.

According to the teachings herein and waveforms 304, 306, current sense element 163 (i.e., resistance $R_{SL}$) may provide a nonzero, positive sense signal SGL to slew detection circuit 133. Comparator 233 may compare positive sense signal SGL to a reference voltage Virf1 (e.g., zero volts) and provide a nonzero state signal VCL. For instance, from time t1a to time t1b waveform 306 maintains a logical high value of one volt. During the slew interval 311 from time t1a to time t1b, the BBM controller 246 may, in response to waveform 306, cause gate drive signal GL and gate drive signal GH to be low (i.e., to sustain "break"). Time t1b may indicate the end-of-slew event; accordingly, at time t1b, the BBM controller 246 may, in response to waveform 306, allow gate drive signal GH to transition high (i.e., to "make"). From time t1b to zero point five microseconds (0.5 us), the gate drive signal GH may remain high while gate drive signal GL may remain low such that the HS cascode power device 126 operates in the on-state while the LS cascode power device 128 operates in the off-state.

At time equal to zero point five microseconds (0.5 us), gate drive signal GH may transition low. As illustrated, from time equal to zero point five microseconds (0.5 us) to time equal to zero point six microseconds (0.6 us), the switch node voltage $V_X$ slews negative from four-hundred volts (400V) to zero volts (0.0V). In response, waveform 301 indicates that device current $I_{DL}$ flows from the LS device 128 toward the switch node NSW. Waveform 302 indicates that a negative, nonzero gate current $I_{GL}$ may be present concurrently.

According to the teachings herein and waveforms 304, 305, current sense element 163 (i.e., resistance $R_{SL}$) may provide a nonzero, negative sense signal SGL to slew detection circuit 133. Comparator 234 may compare negative sense signal SGL to a reference voltage Vrf2 (e.g., zero volts) and provide a nonzero state signal VCL2. For instance, from time t2a to time t2b waveform 305 maintains a logical high value of one volt. During the slew interval 312 from time t2a to time t2b, the BBM controller 246 may, in response to waveform 305, cause gate drive signal GL and gate drive signal GH to be low. Time t2b may indicate the end-of-slew event; accordingly, at time t2b, the BBM controller 246 may, in response to waveform 305, allow gate drive signal GL to transition high. From time t2b to one microsecond (1.0 us), the gate drive signal GL may remain high while gate drive signal GH may remain low such that the LS cascode power device 128 operates in the on-state while the HS cascode power device 126 operates in the off-state.

At time equal to one microsecond (1.0 us), gate drive signal GL may transition low and waveforms 301-306 repeat according to a periodic cycle of one microsecond (1.0 us). As shown over two cycles from zero to two microseconds (2.0 us), there are two positive slew events 311, 313, and two negative slew events 312, 314. Positive slew event 311 (i.e., positive slew) occurs from time t1a to time t1b; and positive slew event 313 occurs from time t3a to time t3b. Negative slew event 312 (i.e., negative slew) occurs from time t2a to time t2b; and negative slew event 314 occurs from time t4a to time t4b.

Although FIG. 3A illustrates detecting slew during periodic cycles of one microsecond (1.0 us), other switching waveforms may be possible. As one of ordinary skill in the art may appreciate, slew may be observed during any transient giving rise to slew current (displacement current). For instance, a slew event can be observed even when devices are not in a normal switching sequence.

Figure 3B:
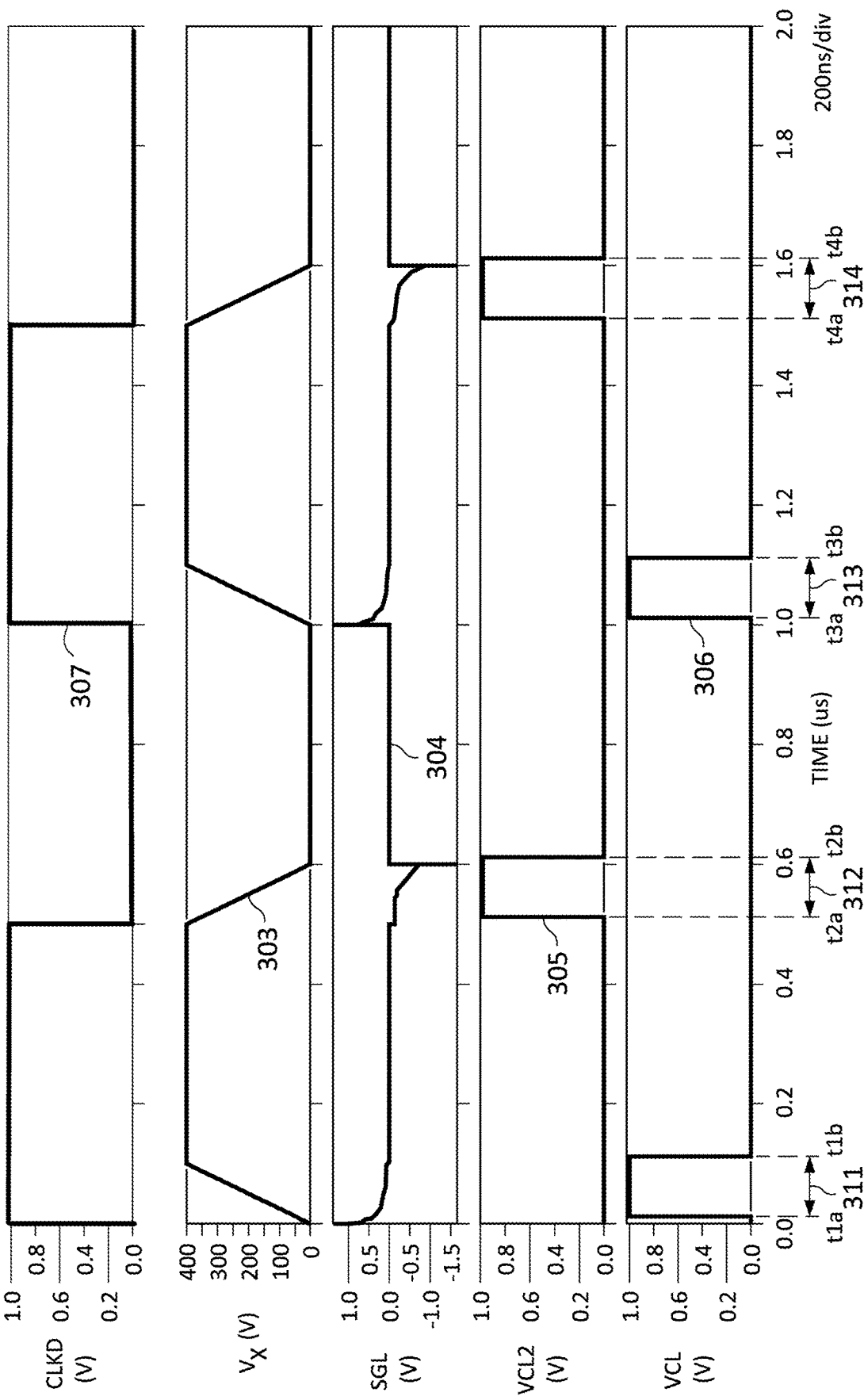
FIG. 3B illustrates waveforms according to the teachings herein.

FIG. 3B illustrates waveforms 303-307 according to the embodiment of FIG. 3A. The waveforms of FIG. 3B are like those of FIG. 3A except they exclude waveforms 301-302 and include waveform 307 corresponding to drive signal CLKD. As discussed above with regards to FIG. 2A, slew may be initiated by edge transitions of the drive signal CLKD.

Figure 4:
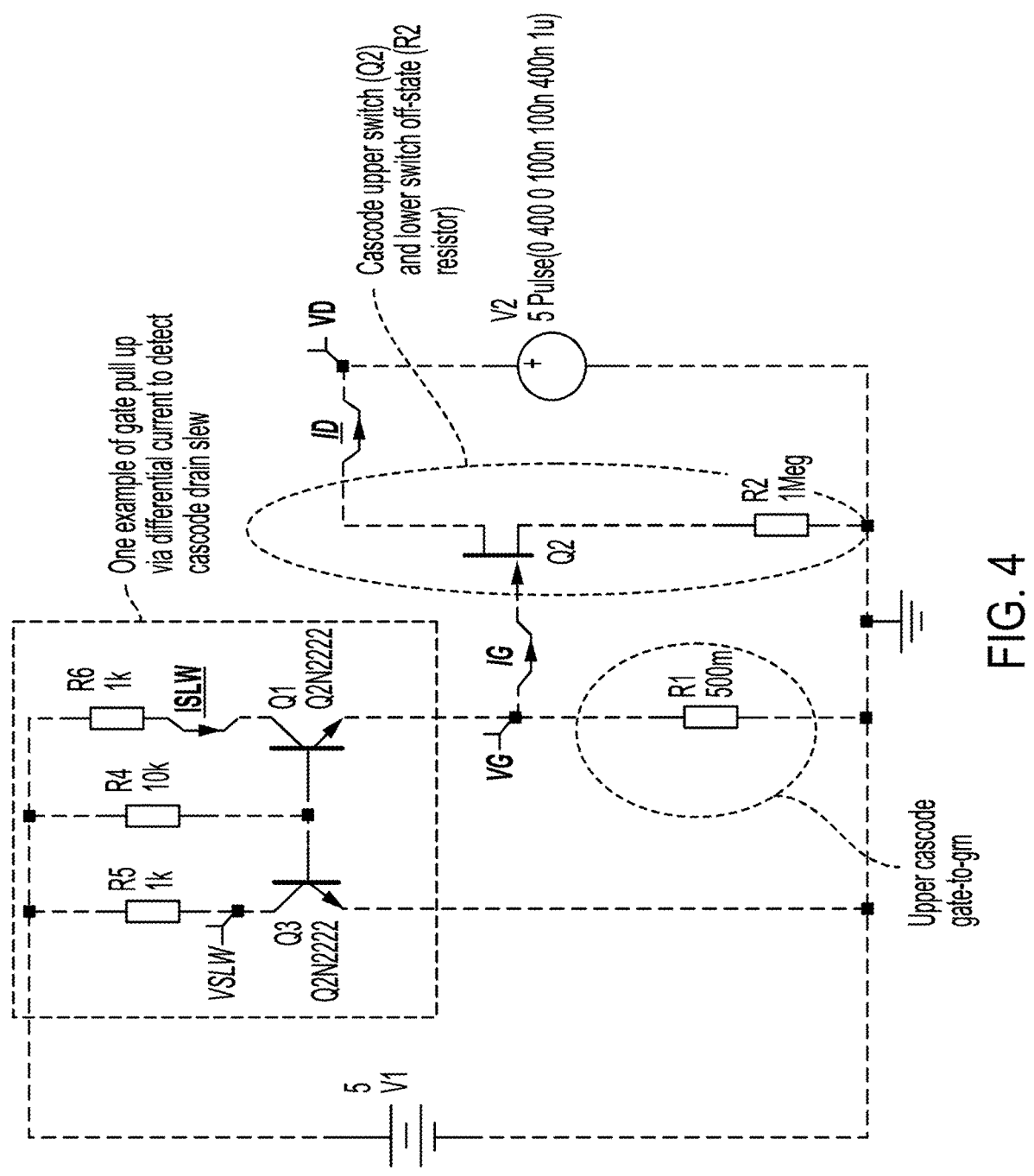
FIG. 4 illustrates a simulation schematic according to an embodiment.

FIG. 4 illustrates a simulation schematic. The simulation schematic includes an upper cascode switch Q2, resistor R2, and voltage source V2. Resistor R2 may represent a lumped model of a lower cascode switch operating in its off state (turn off). The drain voltage VD may be slewed (ramped) by using voltage source V2.

The simulation schematic also includes a current mirror circuit. The current mirror circuit comprises transistors Q3, Q1, resistors R4, R5, R6. The current mirror circuit may provide a pull-up current to the gate of switch Q2.

The simulation schematic further includes resistor R1 which may model resistance (e.g., resistance $R_{SL}$) at the gate of switch Q2.

Figure 5A:
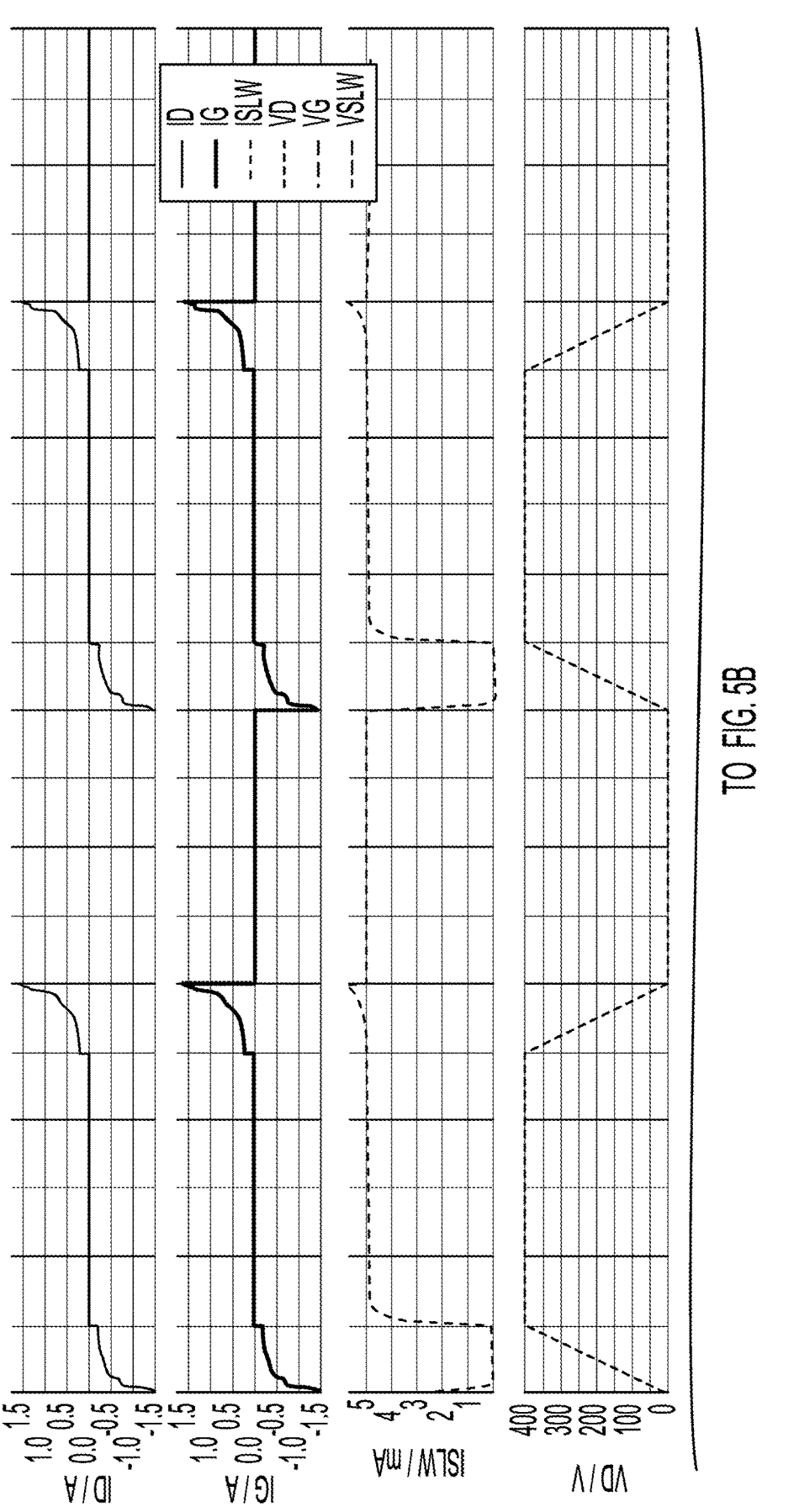
FIGS. 5A and 5B illustrate waveforms corresponding with the simulation schematic of FIG. 4.
Figure 5B:
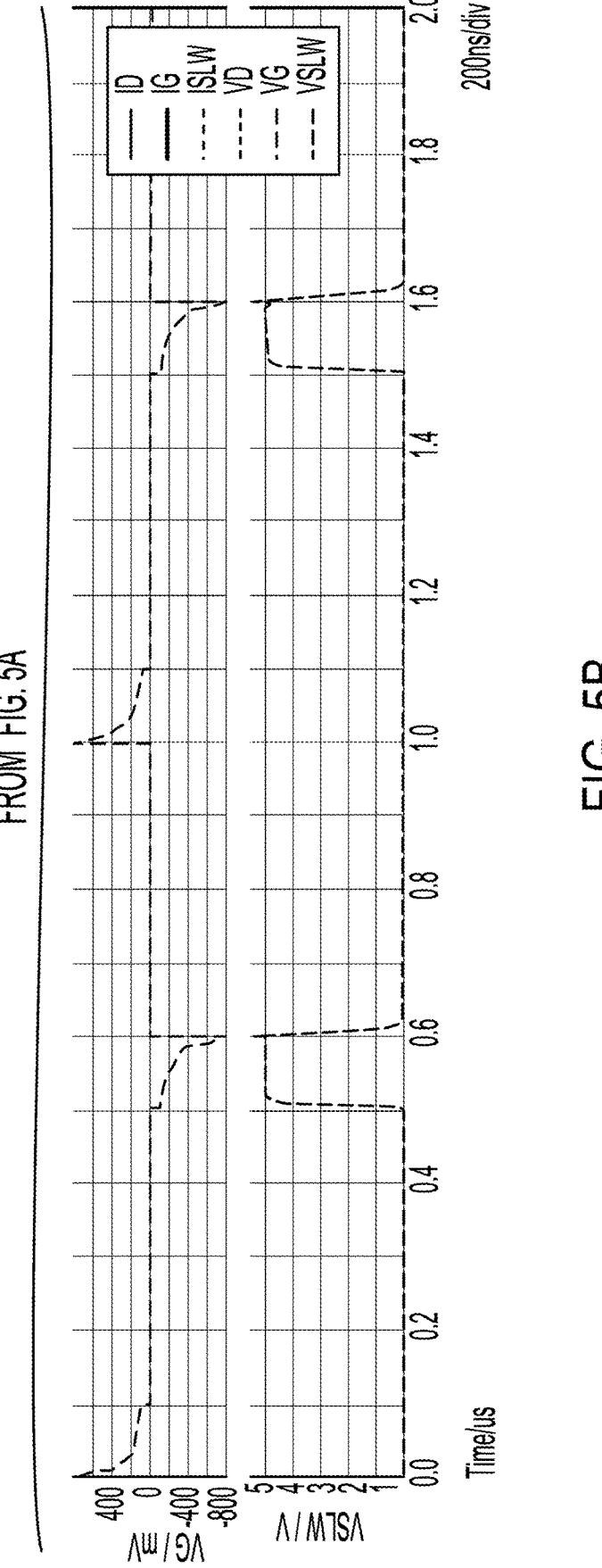

This circuit may detect a negative slew event by monitoring a voltage across resistor R1. A negative voltage on resistor R1 may indicate negative slew and may cause a corresponding output voltage transition, FIGS. 5A and 5B illustrate waveforms of the simulation schematic of FIG. 4. The simulated waveforms include drain voltage VD and gate voltage Vg. As illustrated, the drain voltage VD exhibits slew (ramping up/down periods). The gate voltage Vg can be seen to have a positive period when the slew (i.e., when dVD/dt) is positive. Similarly, the gate voltage Vg may take on negative values when the slew (i.e., when dVD/dt) is negative. In the embodiment of FIG. 4 and FIG. 5, the signal VSLW transitions from low to high during negative slew events (i.e., when dVD/dt is less than zero).

Figure 6:
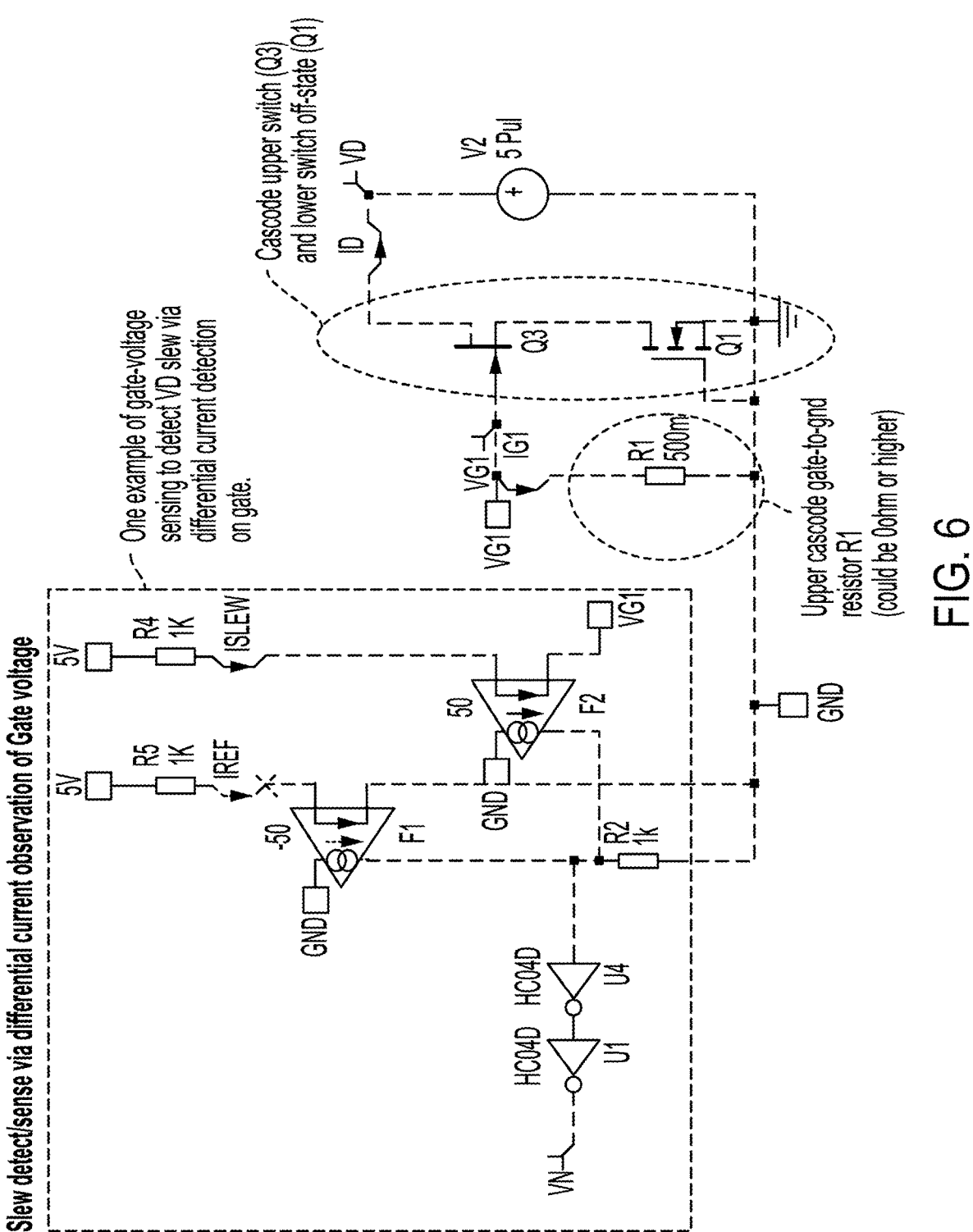
FIG. 6 illustrates a simulation schematic according to an embodiment.

FIG. 6 illustrates a simulation schematic according to another embodiment. The simulation schematic of FIG. 6 may correspond with an embodiment wherein slew detection is based on detecting (sensing) an upper cascode gate differential current. FIG. 6 shows one example of negative cascode-slew detection via upper cascode gate differential current sensing VG1. Current to current converters F1 and F2 generate current signals which combine with difference at resistor R2, which feeds digital buffers U1/U4 to output slew-down signal VN. Signal VN may be provided in response to slew of the cascode drain voltage VD.

Figure 7A:
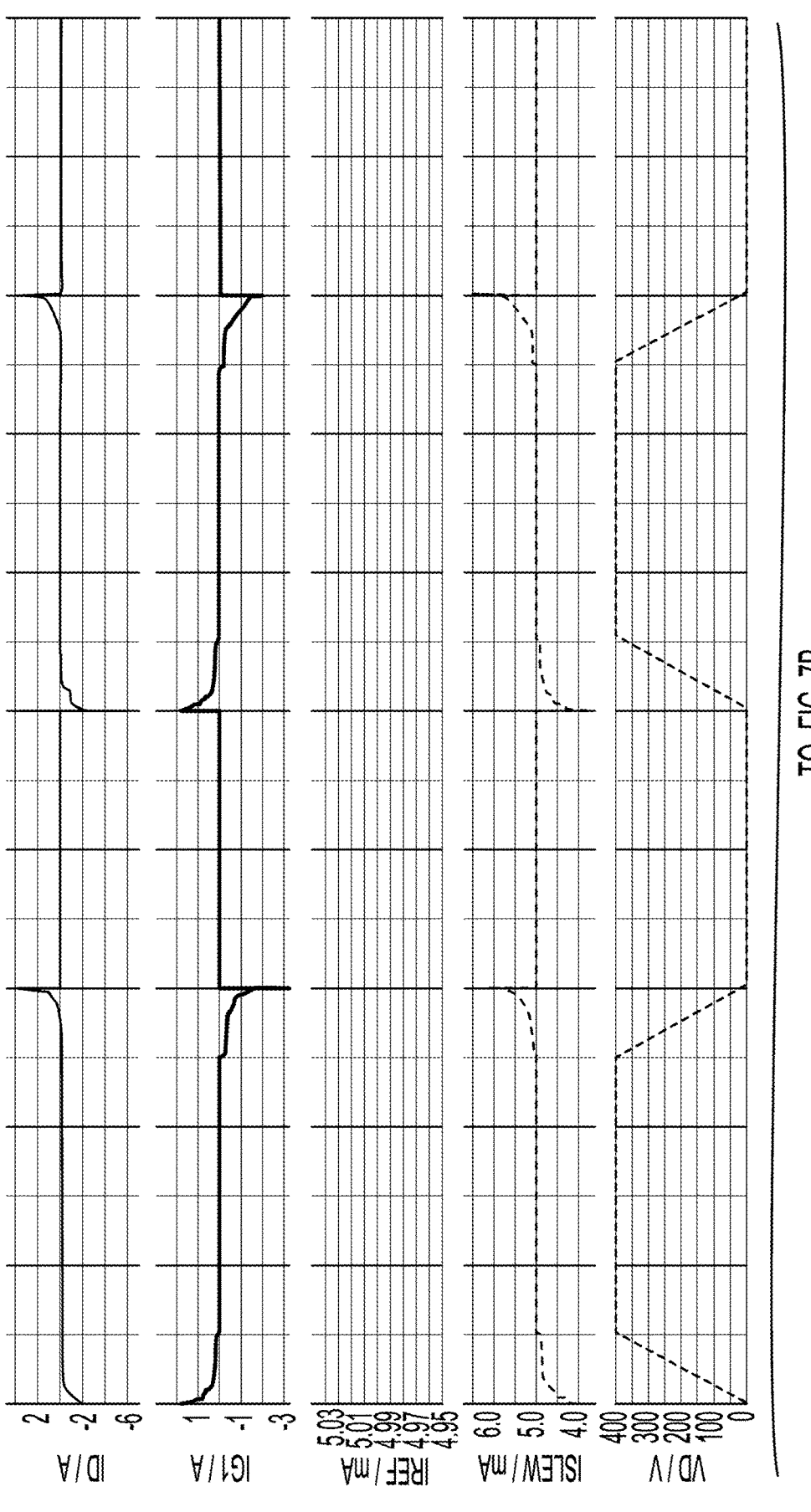
FIGS. 7A and 7B illustrate waveforms corresponding with the simulation schematic of FIG. 6.
Figure 7B:
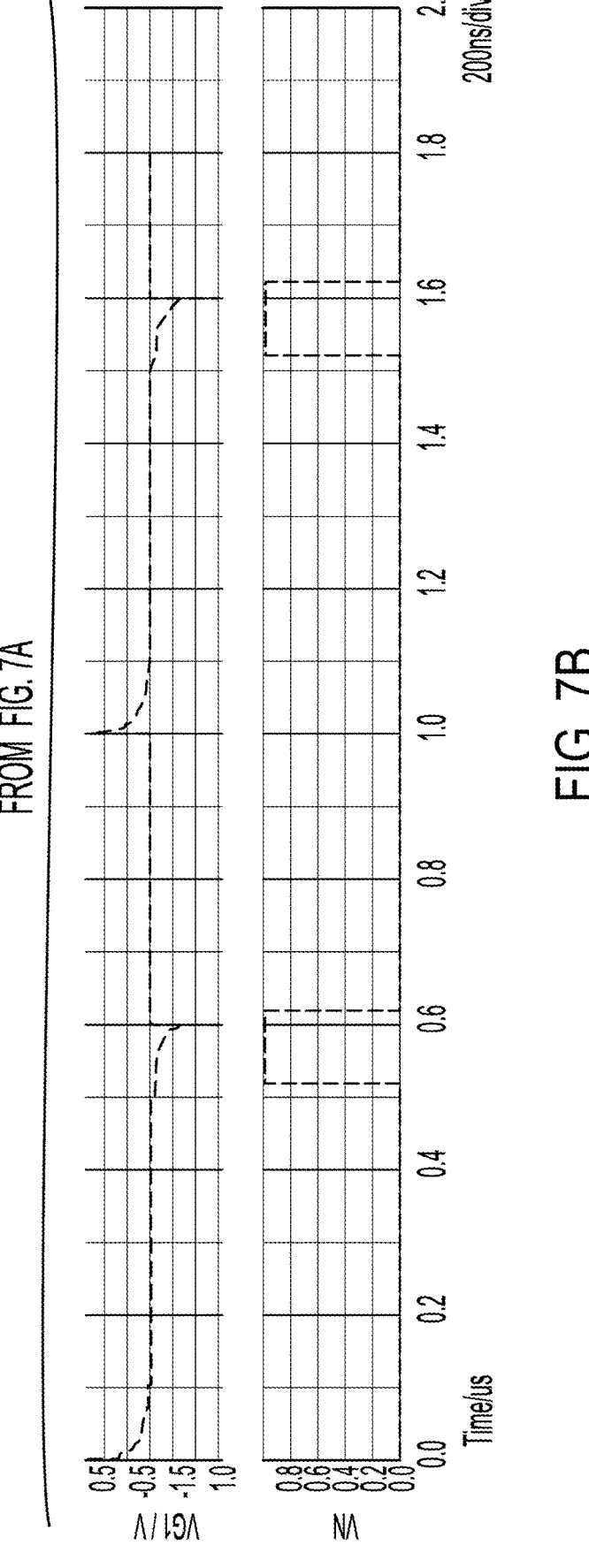

FIGS. 7A and 7B illustrate waveforms of the simulation schematic of FIG. 6.

Figure 8:
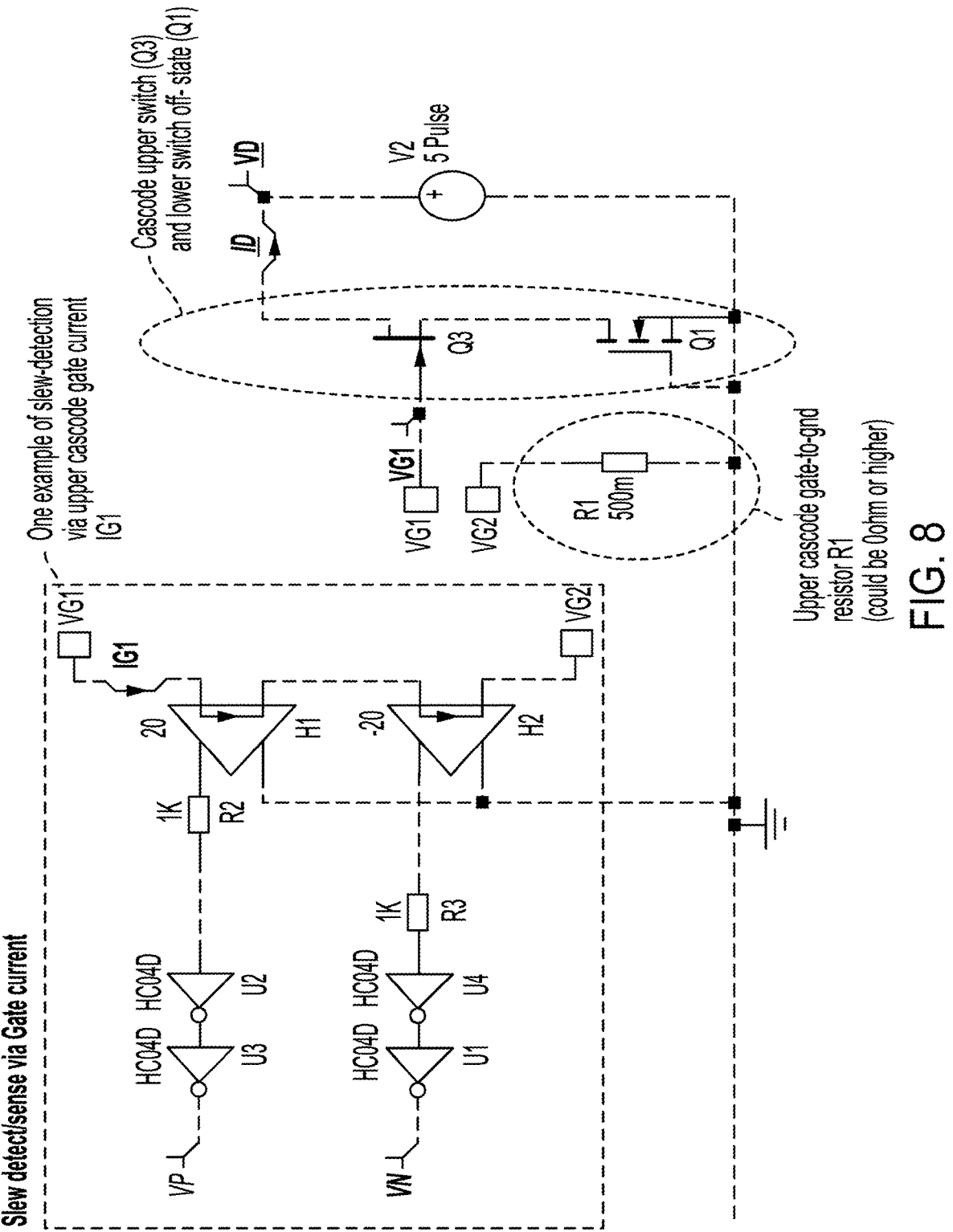
FIG. 8 illustrates a simulation schematic according to an embodiment.

FIG. 8 illustrates a simulation schematic according to another embodiment. The simulation schematic of FIG. 8 may correspond with an embodiment wherein slew detection is based on detecting (sensing) an upper cascode gate current IG1. Current to voltage converters H1 and H2 generate voltage signals which are fed via resistors R2, R3 to digital buffers U3/U2, U1/U4, which in turn output slew-up VP and slew-down VN signals. Thus, slew-up signal VP and slew-down signal VN may be provided in response to slew of the cascode drain voltage VD.

Figure 9A:
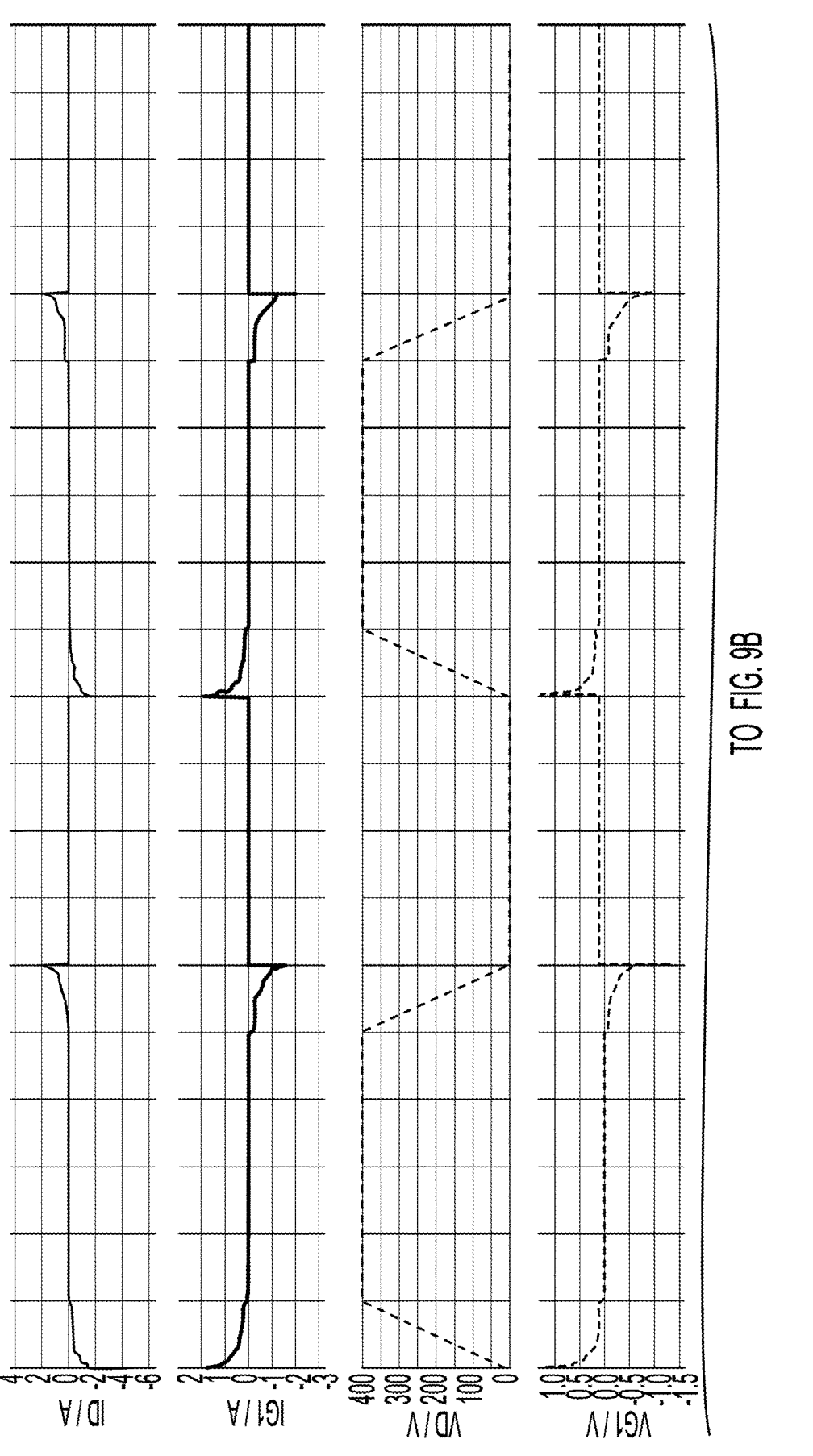
FIGS. 9A and 9B illustrate waveforms corresponding with the simulation schematic of FIG. 8.
Figure 9B:
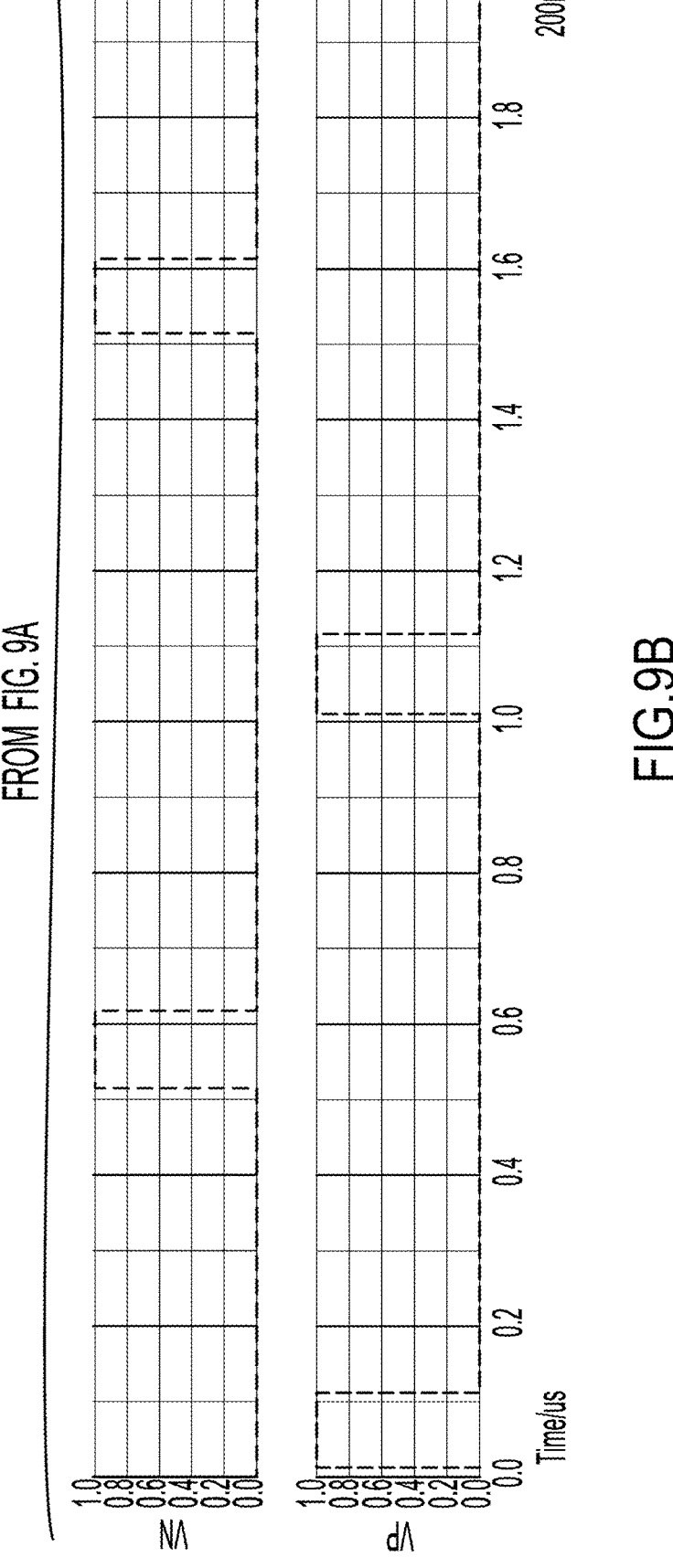

FIGS. 9A and 9B illustrate waveforms of the simulation schematic of FIG. 8.

Figure 10:
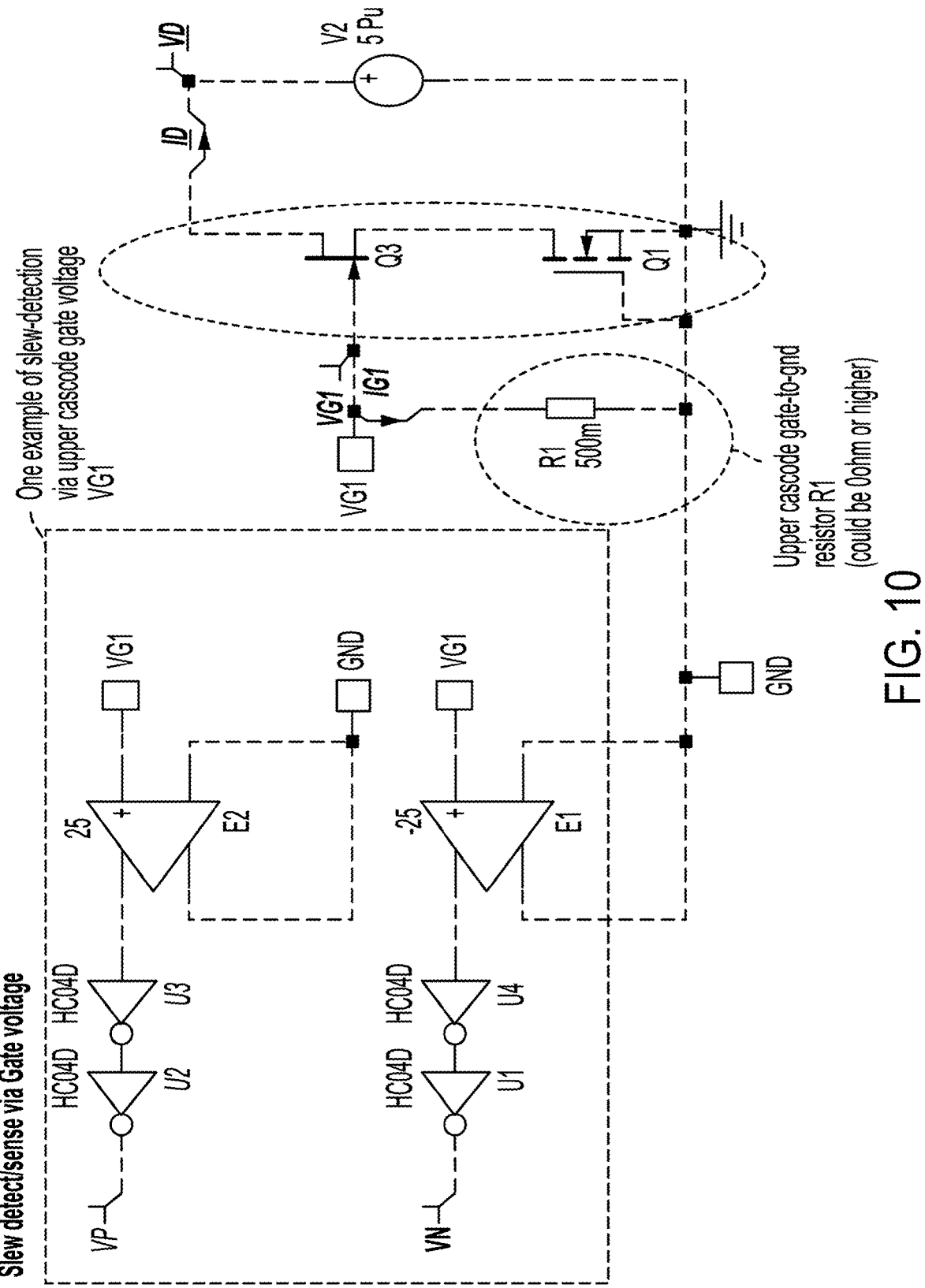
FIG. 10 illustrates a simulation schematic according to an embodiment.

FIG. 10 illustrates a simulation schematic according to another embodiment. The simulation schematic of FIG. 10 may correspond with an embodiment wherein slew detection is based on detecting an upper cascode gate voltage VG1. Voltage amplifiers E2 and E1 generate voltage signals which are fed to digital buffers U3/U2, U1/U4, which in turn output slew-up VP and slew-down VN signals. Thus, slew-up signal VP and slew-down signal VN may be provided in response to slew of the cascode drain voltage VD.

Figure 11A:
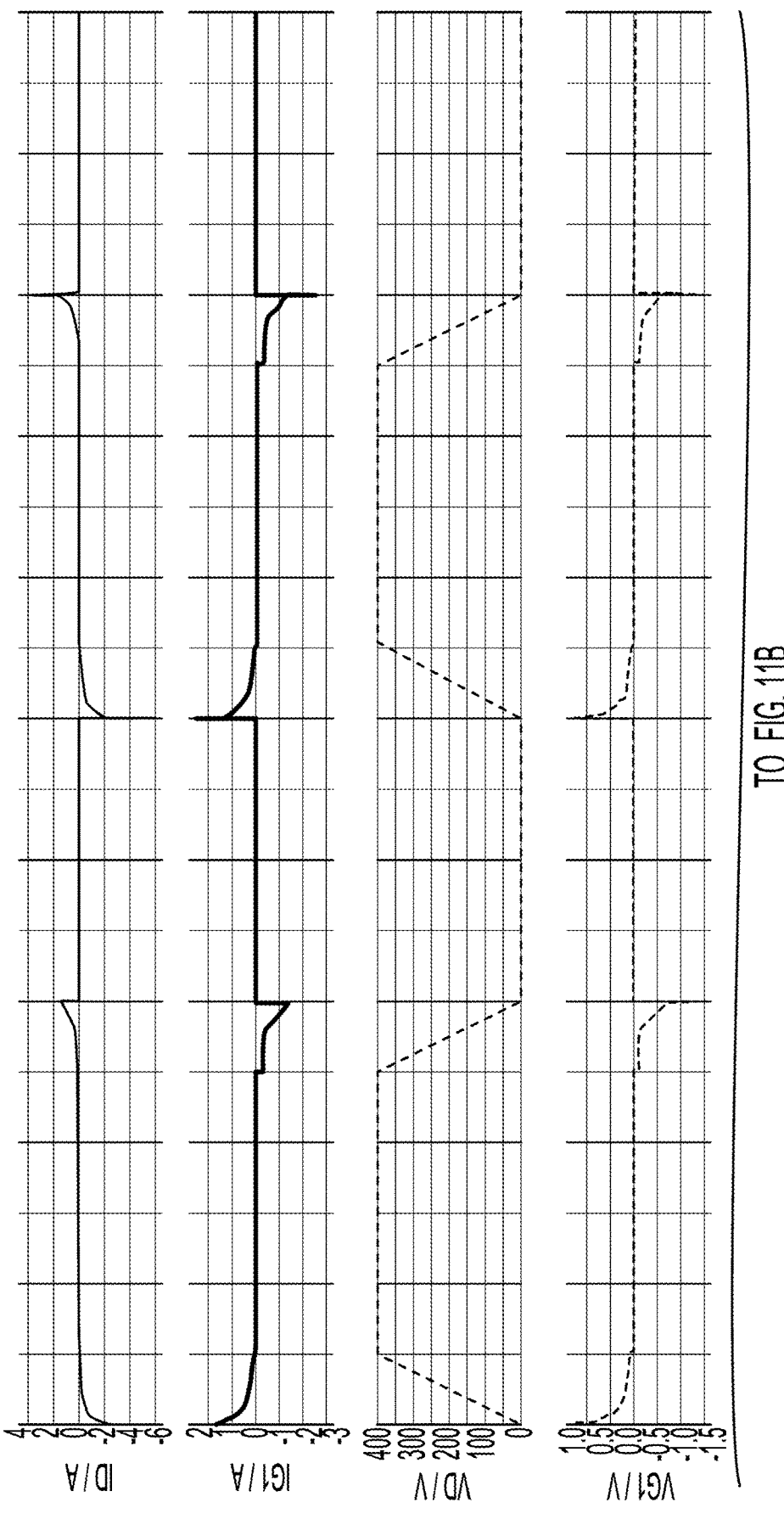
FIGS. 11A and 11B illustrate waveforms corresponding with the simulation schematic of FIG. 10.
Figure 11B:
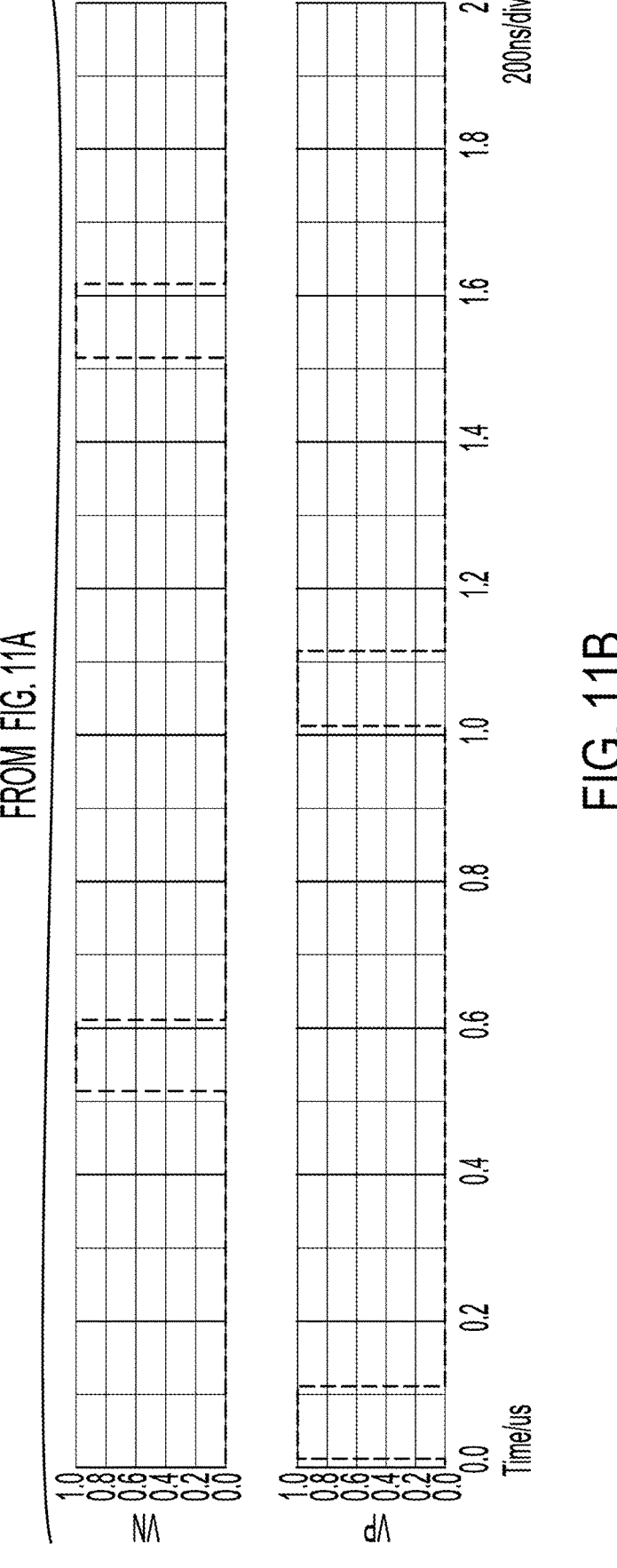

FIGS. 11A and 11B illustrate waveforms of the simulation schematic of FIG. 10.

Although the discussion of FIG. 1A-FIG. 11B relates to detecting slew in power converters, the teachings may also be extended to detecting ringing in power converters. For example, a flyback converter operating in discontinuous mode (DCM) may exhibit ringing; and determining how to control the primary switch may depend upon accurate detection of the ringing cycle. In one example, zero-voltage switching during DCM may be implemented by detecting ringing and by switching (e.g., turning on) the primary switch at an interval determined, at least in part, by the ringing cycle.

Figure 12A:
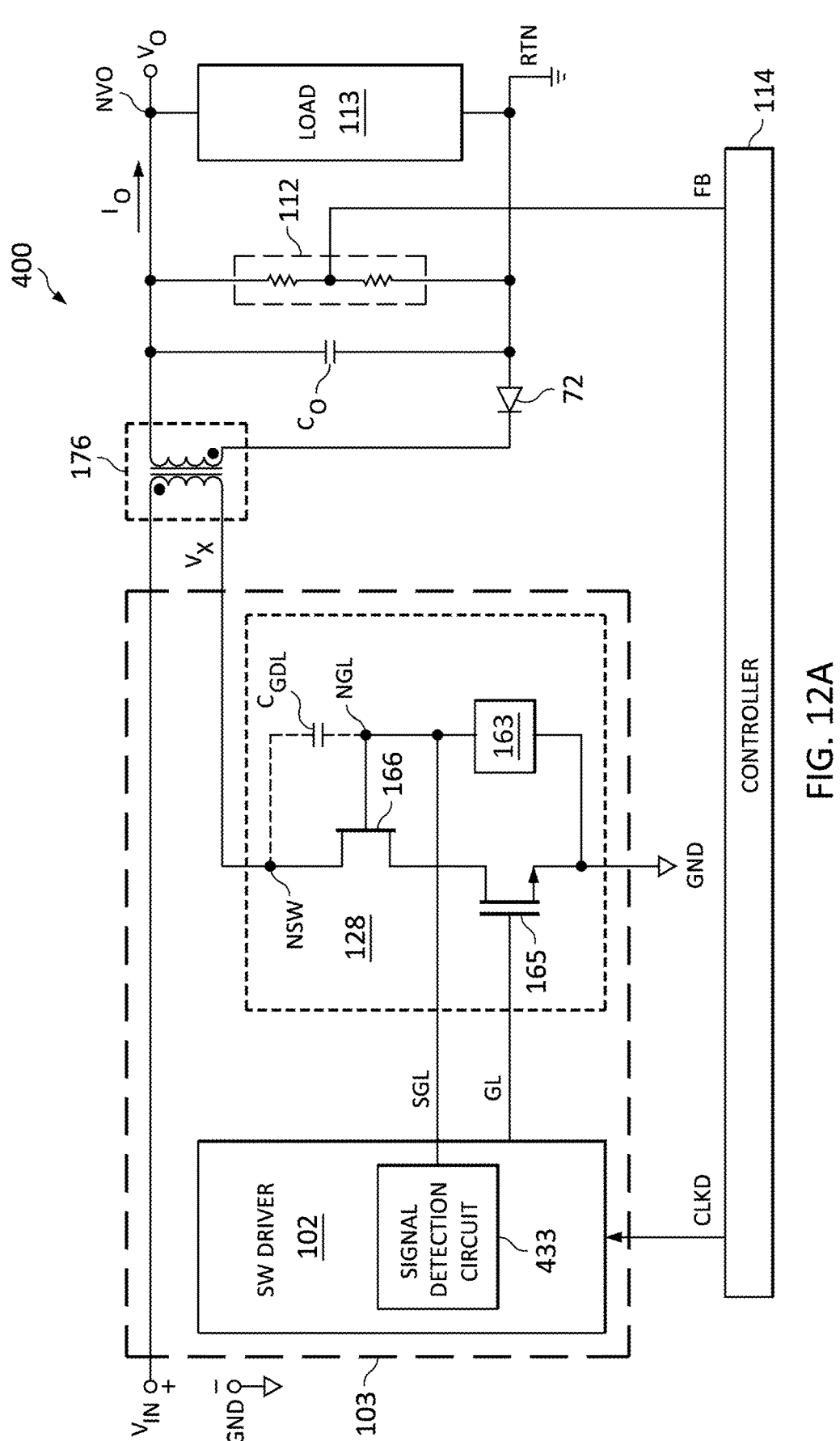
FIG. 12A illustrates a flyback power converter including a signal detection circuit according to an embodiment.

FIG. 12A illustrates a flyback power converter 400 including a signal detection circuit 433 according to an embodiment. As one of ordinary skill in the art may appreciate, LS cascode power device 128 may also be referred to as primary switch in the context of a flyback power converter 400. The embodiment of FIG. 12A is like that of FIG. 1D, in that both embodiments detect signal characteristics. In FIG. 12A, current sense element 163 senses an oscillation, or "ringing" of signal Vin, whereas in the embodiment of FIG. 1D current sense element 163 senses a slew.

As illustrated current sense element 163 may detect oscillations, (e.g., ringing); alternatively, and additionally, current sense element 163 may sense slew of input voltage Vin. First lower NFET 165 and second lower NFET 166 may be realized with gallium nitride (GaN), silicon carbide (SiC), and/or silicon (Si) devices without departing from the scope of the present disclosure. In a slew-detecting application, the embodiment of FIG. 12A may also sense certain conditions of input signal Vin, such as valleys, peaks, or zero-crossings, and the sensing and/or detection such conditions may be used to control other circuitry as desired. Slew and/or ringing, or other oscillations of input voltage Vin, may be sensed in a continuous mode or in a discontinuous mode, as desired.

Delays may be employed to turn on or turn off first lower NFET 165 and/or second lower NFET 166 to allow for break-before-make operation of the embodiment shown in FIG. 12A. For example, a delay after sensing a condition on input voltage Vin may be used to correspond to a turn-on time of first lower NFET 165 and/or second lower NFET 166. Such a delay may be of any value, but may be two microseconds, or any value that allows for break-before-make operation or other desired operation of the overall circuit. Delays may also be used to reset counters or prevent signals from becoming active, (e.g., sense signal SGL and/or gate signal GL to prevent the first lower NFET 165 and second lower NFET 166 from being on at the same time. Delays may be implemented in the switch driver 102, signal detection circuit 433, or elsewhere in the circuit shown in FIG. 12A.

Figure 12B:
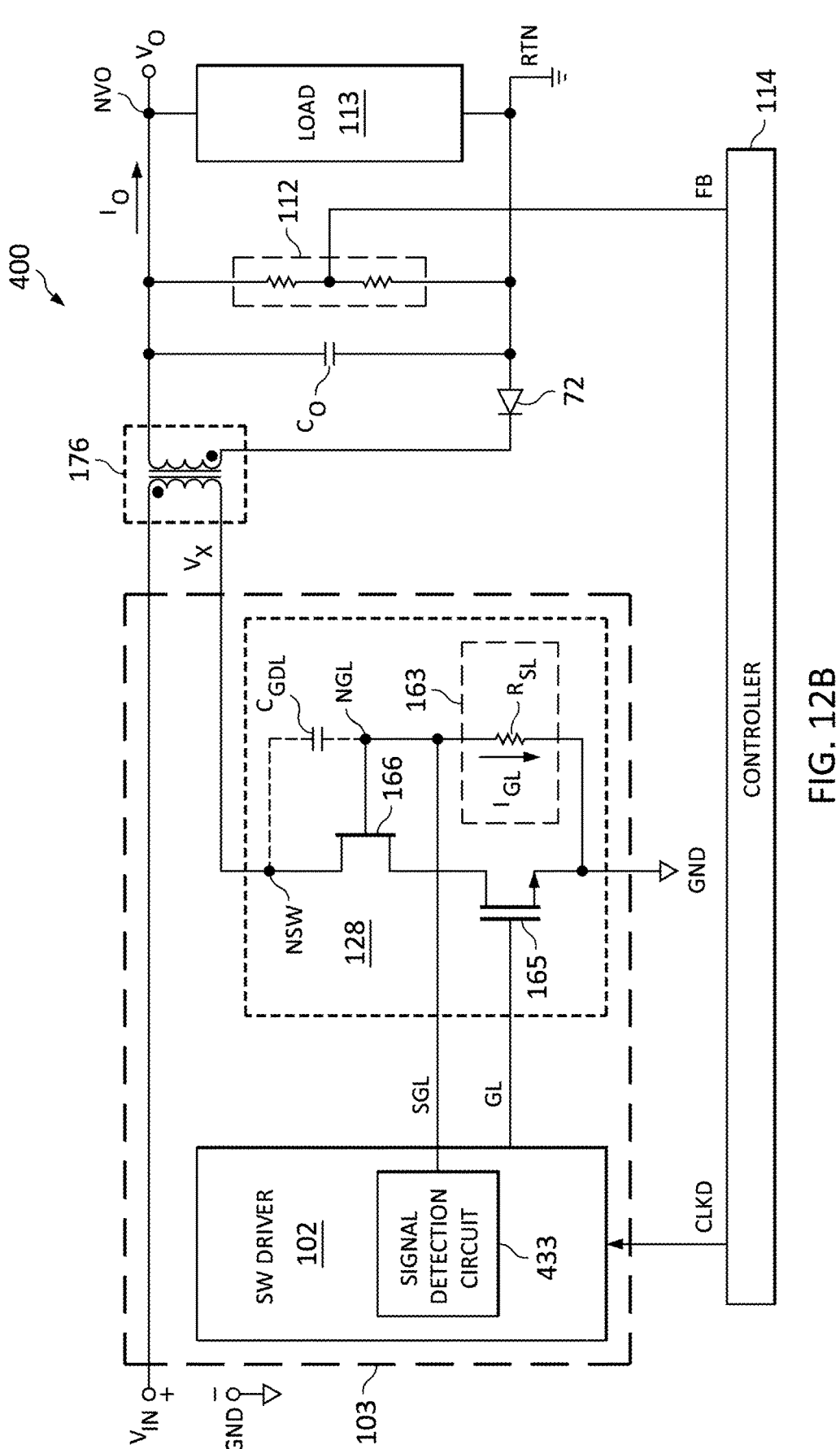
FIG. 12B illustrates a flyback power converter including a signal detection circuit according to an embodiment.

FIG. 12B illustrates a flyback power converter 400 including a signal detection circuit 433 according to an embodiment. The embodiment of FIG. 12B is like that of FIG. 12A except current sense element 163 is shown as including resistance $R_{SL}$. Accordingly, current sense element 163 may detect and/or monitor slew current $I_{XL}$ by providing sense signal SGL in response to gate current IG in resistance $R_{SL}$.

When cascode power device 128 is off, the capacitance $C_{GDL}$ and the resistance $R_{SL}$ may be treated as a differentiator. Accordingly, the sense signal SGL at gate node NGL may be a voltage resulting from differentiation of the switch node voltage $V_X$.

Figure 13:
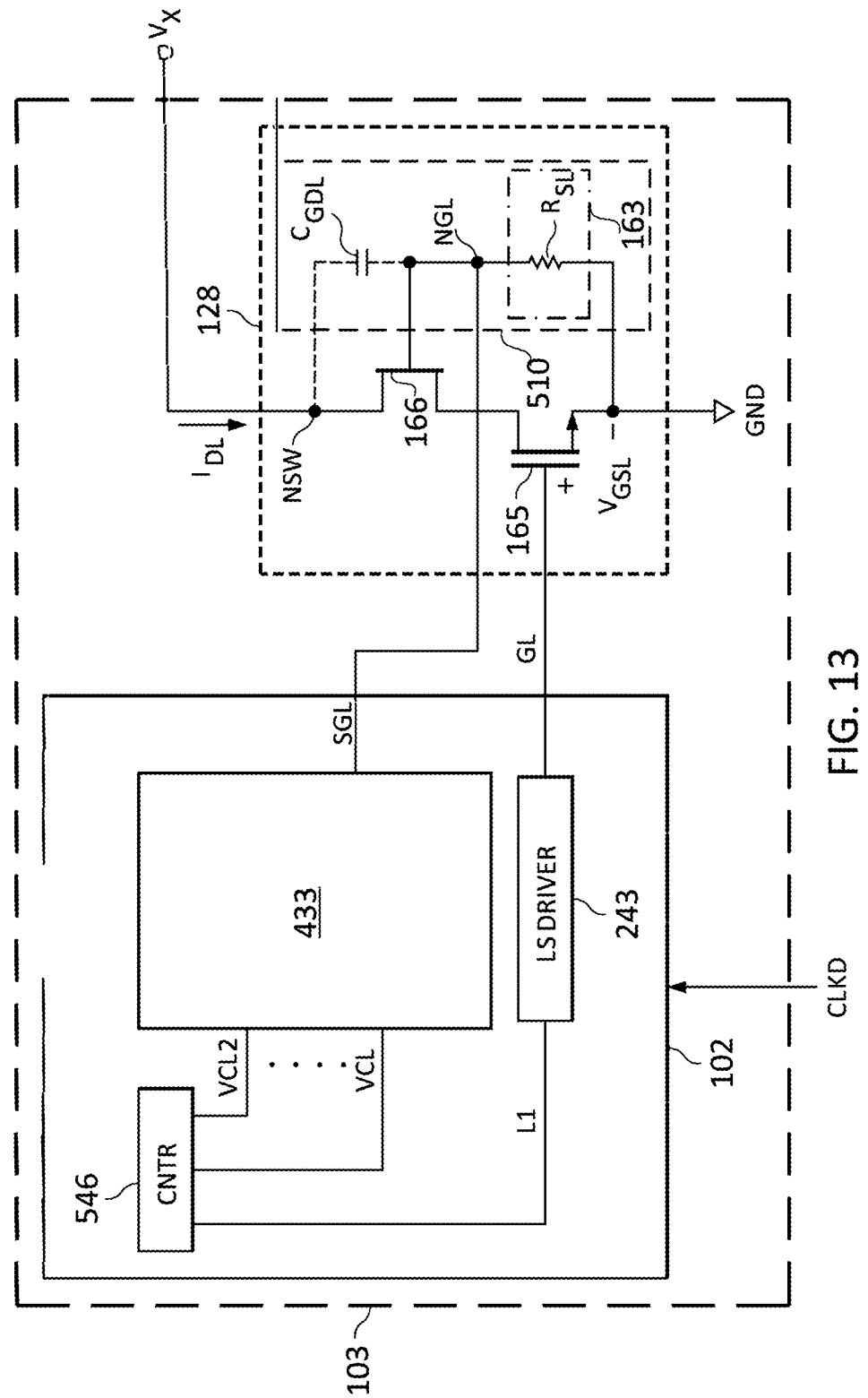
FIG. 13 illustrates a primary bridge circuit according to an embodiment.

FIG. 13 illustrates a primary bridge circuit 103 according to an embodiment. Primary bridge circuit 103 of FIG. 13 is like that of FIG. 2D excluding HS cascode device 126. The embodiment of FIG. 13 may be used to determine when the switch node voltage $V_X$ oscillates, rings, and/or undergoes transitions (e.g., slews) similar to the configuration of FIG. 2D, which determines when the switch node voltage $V_X$ slews.

Switch driver 102 includes a low side (LS) driver 243, a controller 546, and a signal detection circuit 433. Controller 546 may receive state signals VCL, VCL2 and in response provide signal L1.

As illustrated, a signal detection circuit 433 may receive a sense signal SGL signal and, in response, provide state signals VCL, VCL2 based, at least in part, upon the characteristics of sense signal SGL. For instance, state signals VCL, VCL2 may be provided by comparing sense signal SGL with a reference signal to determine the presence of oscillations, ringing, and/or slew on sense signal SGL.

Other methods of determining when the sense signal SGL varies are possible within the scope of the present disclosure. For instance, during oscillation, sense signal SGL may vary in a manner such that signal detection circuit 433 produces one or more state signals VCL, VCL2. As the oscillation of sense signal SGL decreases below a threshold, or is less than a desired amount, sense signal SGL may fall within a tolerance and signal state VCL may transition low, indicating that the oscillation of sense signal SGL has ended.

Figure 14A:
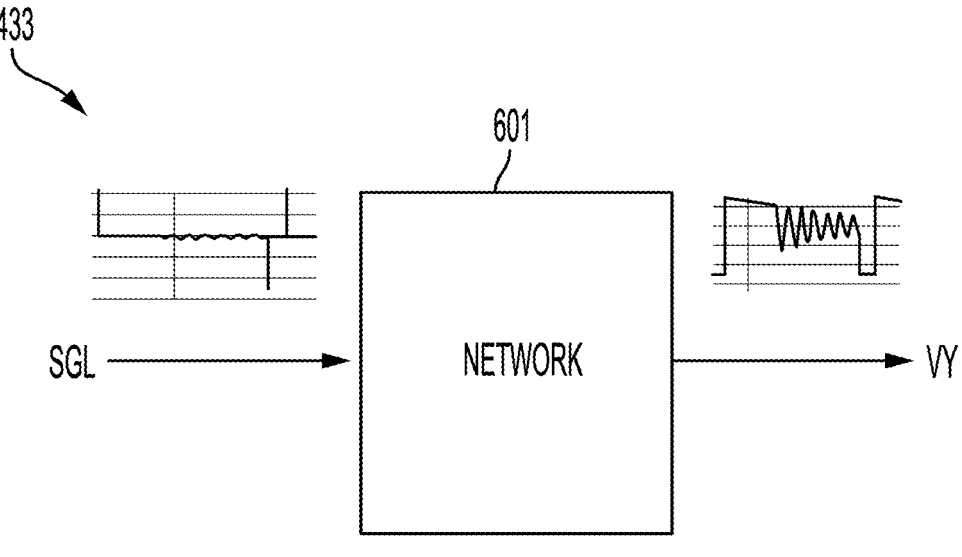
FIG. 14A illustrates a signal detection circuit according to an embodiment.

FIG. 14A illustrates a signal detection circuit 433 according to an embodiment. Signal detection circuit 433 includes a network 601 which may provide signal VY in response to sense signal SGL As discussed above with regards to FIG. 12B, the capacitance $C_{GDL}$ and the resistance $R_{SL}$ may be treated as a differentiator so that sense signal SGL may have high frequency content of the switch node voltage $V_X$. According to the teachings herein, signal VY, as provided by network 601, may advantageously reconstruct and/or replicate a waveform of the switch node voltage $V_X$ from sense signal SGL. For instance, network 601 may comprise an integrator.

Figure 14B:
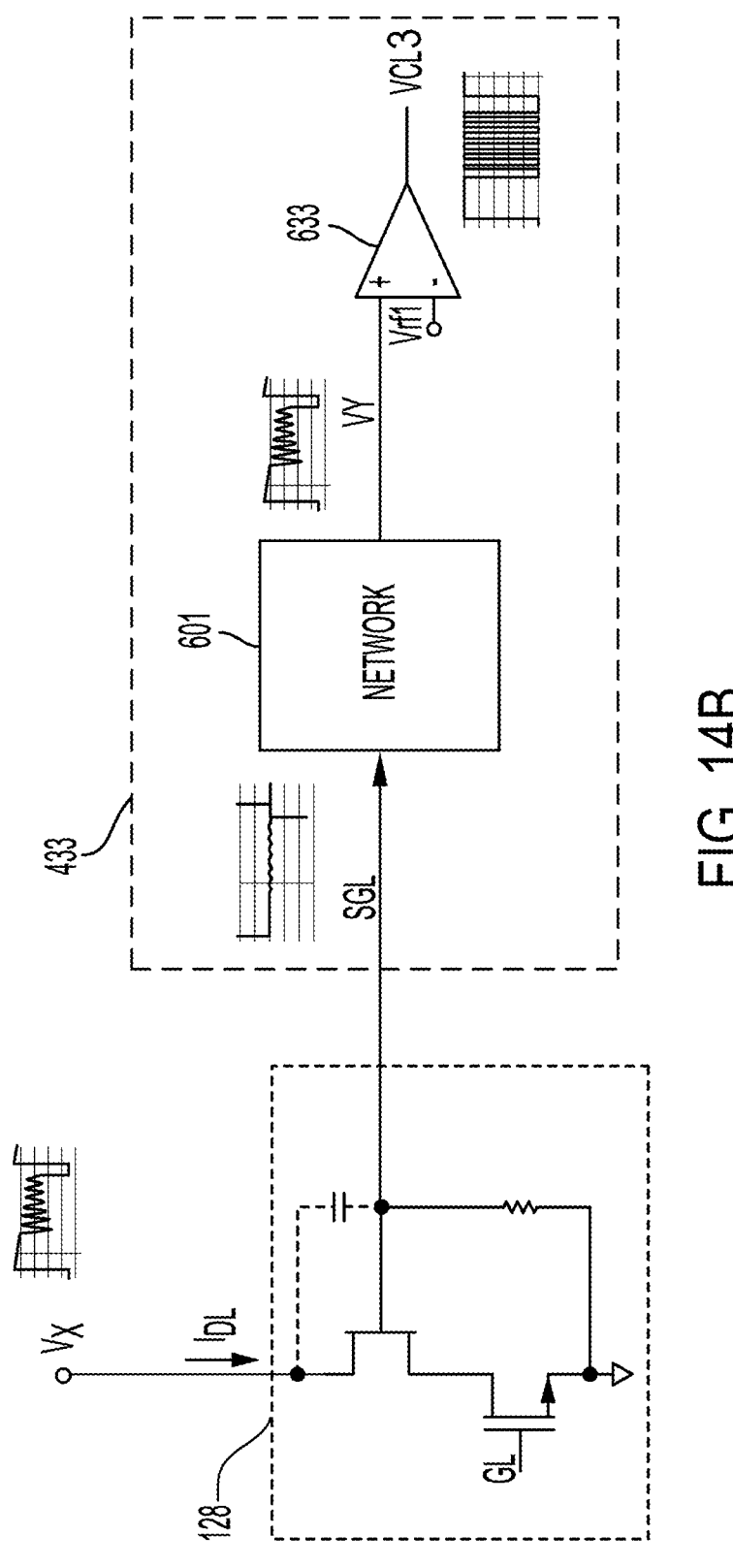
FIG. 14B illustrates a signal detection circuit according to an embodiment.

FIG. 14B illustrates a signal detection circuit 433 according to an embodiment. Like that of FIG. 14A, signal detection circuit 433 of FIG. 14B includes network 601 which accepts sense signal SGL and provides signal VY. As discussed with respect to FIG. 13, network 601 may provide signal VY as a replica of the switch node voltage $V_X$ from sense signal SGL.

Signal VY may be coupled to comparator 633. Comparator 633 may compare reference voltage Virf1 at its inverting input with signal VY at its noninverting input to provide state signal VCL3. Comparator 633 may provide state signal VCL3 having signal content like that of signal VY. Accordingly, state signal VCL3 may advantageously comprise information (e.g., the period and frequency of oscillation) corresponding with ringing (e.g., the ringing of switch node voltage $V_X$).

Figure 14C:
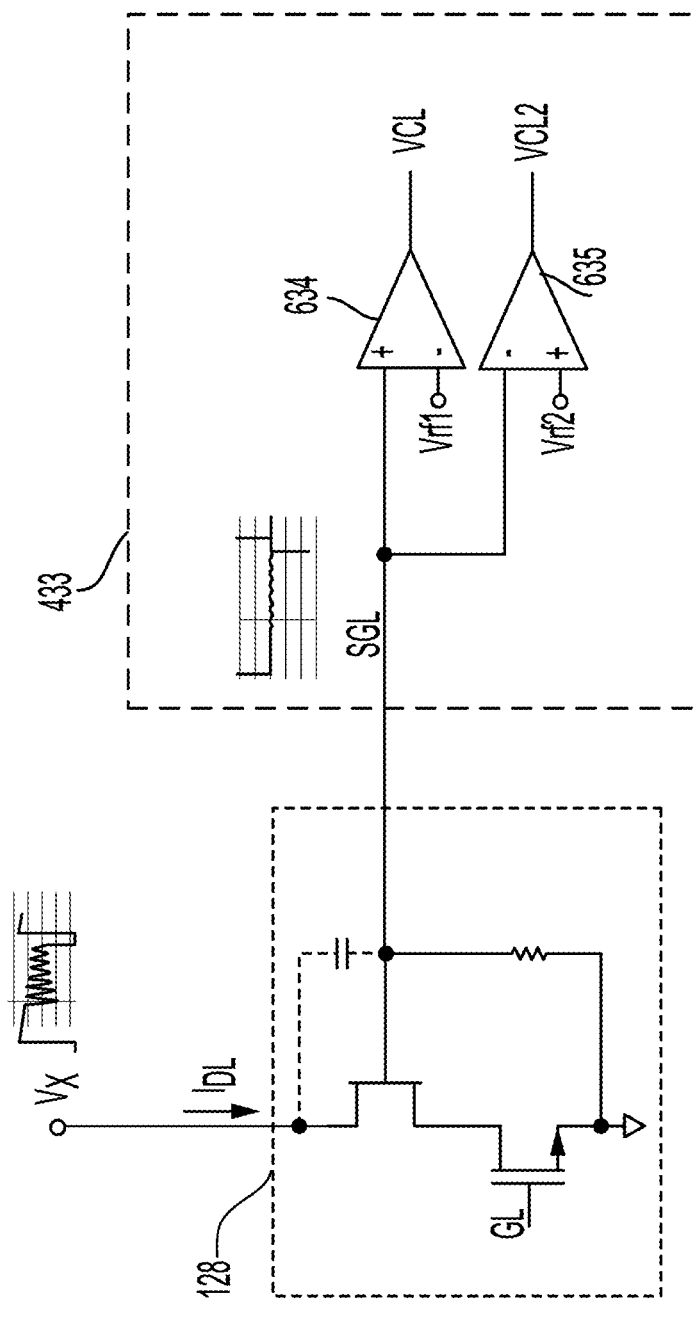
FIG. 14C illustrates a signal detection circuit according to an embodiment.

FIG. 14C illustrates a signal detection circuit 433 according to an embodiment.

The embodiment of FIG. 14C is like that of embodiment of FIG. 14B, except sense signal SGL is used as an input to comparators 634, 635 and compared directly to reference voltages Vrf1, Vrf2 to produce state signals VCL, VCL2. Comparators 634, 635 may be like comparators 233, 253. Accordingly, comparator 635 may provide state signal VCL2 in response to negative slew (e.g., negative slope); and comparator 634 may provide state signal VCL in response to positive slew.

Figure 15A:
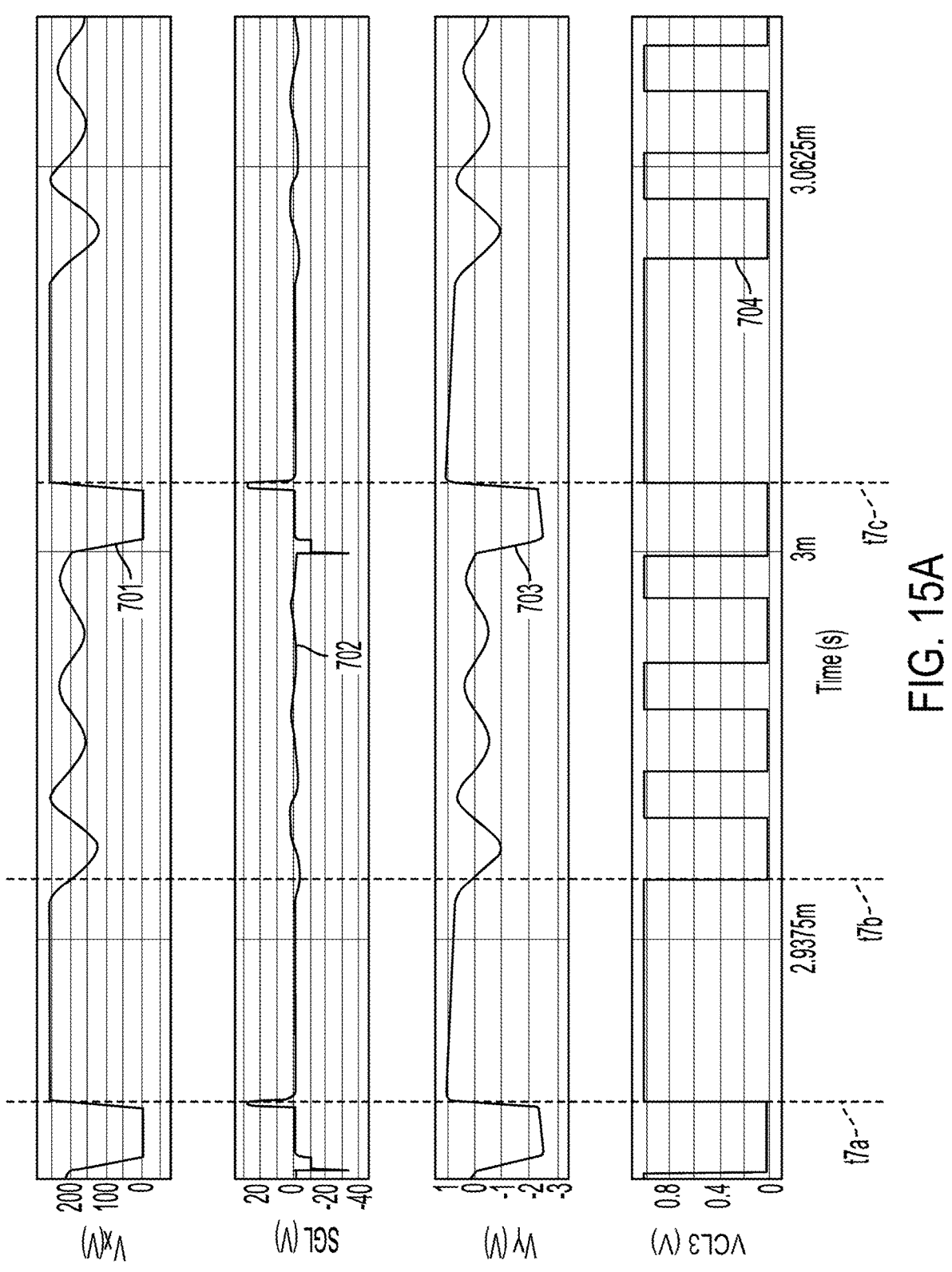
FIG. 15A illustrates waveforms according to the embodiment of FIG. 14B.

FIG. 15A illustrates waveforms 701-704 according to the embodiment of FIG. 14B. Waveforms 701 may correspond with the switch node voltage $V_X$. Waveform 702 may correspond with sense signal SGL. Waveform 703 may correspond with signal VY as provided by network 601; and waveform 704 may correspond with state signal VCL3 provided by comparator 633.

With reference to FIG. 13 and FIG. 14B, at time t7a gate drive signal GL may transition low to turn the LS cascode power device 128 off. Accordingly, the switch node voltage $V_X$ (waveform 701) transitions high and remains high until time t7b, the onset of ringing. At time t7c the gate drive signal GL may transition high to turn the LS cascode power device 128 on.

In accordance with the operation of flyback power converter 400, the switch node voltage $V_X$ (waveform 701) exhibits ringing from time t7b to time t7c. As illustrated, network 601 may receive sense signal SGL (waveform 702) and provide signal VY (waveform 703) as a replica of the switch node voltage $V_X$. In turn, comparator 633 may provide state signal VCL3 (waveform 704) having the same variation (e.g., switching pattern) as the switch node voltage $V_X$. Accordingly, state signal VCL3 may provide information (i.e., ringing and frequency) to controller 546.

For instance, state signal VCL3 (waveform 704) exhibits edge transitions (i.e., exhibits rising and falling edges) in response to the zero crossings of signal VY (waveform 703). Accordingly, state signal VCL3 may provide information regarding the ringing of the switch node voltage $V_X$ between time t7b and time t7c.

Figure 15B:
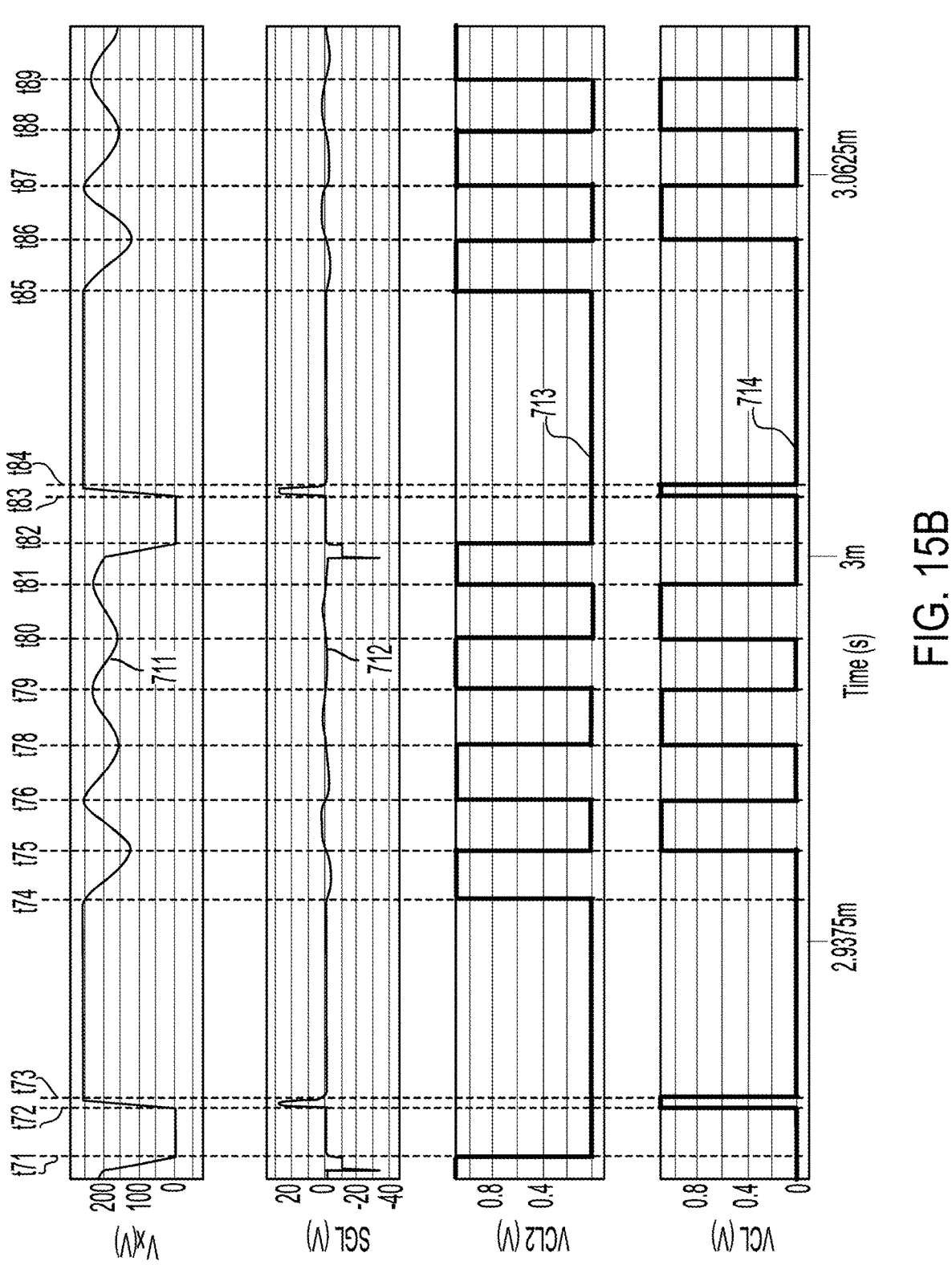
FIG. 15B illustrates waveforms according to the embodiment of FIG. 14C.

FIG. 15B illustrates waveforms 711-714 according to the embodiment of FIG. 14C. With reference to FIG. 14C, waveform 711 may correspond with the switch node voltage $V_X$. Waveform 712 may correspond with sense signal SGL. Waveform 713 may correspond with state signal VCL2 provided by comparator 635; and waveform 714 may correspond with state signal VCL provided by comparator 634.

As discussed above with respect to FIG. 14C, comparators 634, 635 may provide state signals VCL, VCL2 in response to negative slew and positive slew. Also, as illustrated, at times t71-t89 the rate of change of the switch node voltage $V_X$ may be substantially zero. Accordingly, at times t71-t89 the sense signal SGL is substantially equal to zero volts.

Furthermore, during time intervals when slew is positive (i.e., when sense signal SGL is greater than reference voltage Vrf1) state signal VCL is a logic high (e.g., one volt). Conversely, during time intervals when slew is negative (i.e., when sense signal SGL is less than reference voltage Vrf2) state signal VCL2 is a logic high (e.g., one volt).

For instance, during the interval from time t74 to time t75, the switch node voltage $V_X$ has negative slope (i.e., has negative slew), and state signal VCL2 is logic high; during the subsequent interval from time t75 to time t76, the switch node voltage $V_X$ has positive slope (i.e., has positive slew), and state signal VCL is logic high.

CONCLUSION

The above description of illustrated examples of the present disclosure, including what is described in the Abstract, are not intended to be exhaustive or to be limitation to the precise forms disclosed. While specific embodiments of, and examples for detecting signals from cascode power devices are described herein for illustrative purposes, various equivalent modifications are possible without departing from the broader spirit and scope of the present disclosure. Indeed, it is appreciated that the specific example voltages, currents, frequencies, power range values, times, etc., are provided for explanation purposes and that other values may also be employed in other embodiments and examples in accordance with the teachings herein.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions, and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A power converter comprising:
   a cascode power device comprising a first device and a second device electrically coupled in cascode to a switch node, the switch node configured to provide a switch node voltage according to a switching cycle;
   a current sense element electrically coupled to a gate of the second device and configured to provide a sense signal in response toa signal at the gate of the second device, wherein the current sense element comprises a resistance electrically coupled between the gate of the second device and a source of the first device;
   a switch driver configured to provide a gate drive signal to a gate of the first device in response to a drive signal;
   a signal detection circuit configured to provide a state signal in response to the sense signal, wherein the signal detection circuit comprises a comparator configured to provide the state signal in response to a comparison of the sense signal with a reference; and
   a break before make controller, wherein the break before make controller is configured to control the gate drive signal in response to the state signal and the drive signal such that the first device operates in an off state during a portion of the drive signal and transitions to an on state at a conclusion of the portion of the drive signal.

2. The power converter of claim 1, wherein the signal at the gate of the second device is a slew current.

3. The power converter of claim 1, wherein the source of the first device is electrically coupled to ground and a drain of the second device is electrically coupled to the switch node.

4. The power converter of claim 1, wherein the source of the first device is electrically coupled to the switch node and a drain of the second device is electrically coupled to a supply node.

5. The power converter of claim 1, wherein the comparator is a voltage comparator and the reference is a voltage.

6. The power converter of claim 1, wherein the comparator is a current comparator and the reference is a current.

7. The power converter of claim 1, wherein the first device is an enhancement mode n-channel field effect transistor (NFET) and the second device is a depletion mode NFET.

8. The power converter of claim 7, wherein the depletion mode NFET is a depletion mode gallium nitride (GaN) NFET.

9. The power converter of claim 1, wherein the drive signal includes an oscillation of at least one of a voltage and a current.

10. The power converter of claim 9, wherein the switch driver selectively provides the gate drive signal based at least in part on the oscillation.

11. The power converter of claim 10, wherein the switch driver selectively provides the gate drive signal at an interval determined at least in part by a frequency of the oscillation.

12. A power converter, comprising:
   a first power circuit electrically coupled to an input of the power converter, wherein the first power circuit comprises:
      a first transistor;
      a second transistor electrically connected in cascode with the first transistor; and
      a current sense element configured to provide a sense signal in response to a signal at a gate of the second transistor, wherein the current sense element comprises a resistance electrically coupled between a source of the first transistor and the gate of the second transistor;

a second power circuit, electrically coupled between electrical ground and the first power circuit at a switch node, the switch node configured to provide a switch node voltage according to a switching cycle;

a driver circuit electrically coupled to a first control connection of the first power circuit and to a second control connection of the second power circuit, wherein the driver circuit is configured to selectively control the first power circuit and the second power circuit in response to a drive signal;

a detection circuit configured to provide a state signal in response to the sense signal, wherein the detection circuit comprises a comparator configured to provide the state signal in response to a comparison of the sense signal with a reference; and a break before make controller, wherein the break before make controller is configured to control a gate drive signal provided to a gate of the first transistor, via the first control connection of the first power circuit, in response to the state signal and the drive signal such that the first transistor operates in an off state during a portion of the drive signal and transitions to an on state at a conclusion of the portion of the drive signal.

13. The power converter of claim 12, wherein the first transistor is an enhancement mode n-channel field effect transistor (NFET) and the second transistor is a depletion mode NFET.

14. The power converter of claim 12, wherein the second power circuit includes a third transistor and a fourth transistor electrically connected in cascode.

15. The power converter of claim 14, wherein the third transistor is an enhancement mode n-channel field effect transistor (NFET) and the fourth transistor is a depletion mode NFET.

16. The power converter of claim 15, wherein the switch node is electrically coupled to a load of the power converter.

17. The power converter of claim 12, wherein the signal at the gate of the second transistor is a slew current.

18. The power converter of claim 12, wherein the drive signal includes an oscillation of at least one of a voltage and a current.

19. The power converter of claim 18, wherein the driver circuit selectively controls at least one of the first power circuit and the second power circuit based at least in part on the oscillation.

20. The power converter of claim 19, wherein the driver circuit selectively controls at least one of the first power circuit and the second power circuit at an interval determined at least in part by a frequency of the oscillation.

21. The power converter of claim 12, wherein the driver circuit further comprises circuitry configured to selectively control the second power circuit with the second control connection to change the operational state of the second power circuit at the conclusion of the portion of the drive signal.

\*    \*    \*    \*    \*